United States Patent
Spotti

(10) Patent No.: US 11,152,530 B2
(45) Date of Patent: Oct. 19, 2021

(54) ASSEMBLY METHOD AND COMBINED BIVALENT STATION FOR PHOTOVOLTAIC PANELS

(71) Applicant: VISMUNDA SRL, Padua (IT)

(72) Inventor: Davide Spotti, Treviso (IT)

(*) Notice: Subject to any disclaimer, the term of this patent is extended or adjusted under 35 U.S.C. 154(b) by 72 days.

(21) Appl. No.: 16/601,244

(22) Filed: Oct. 14, 2019

(65) Prior Publication Data

US 2020/0119221 A1 Apr. 16, 2020

(30) Foreign Application Priority Data

Oct. 12, 2018 (IT) .................. 102018000009389

(51) Int. Cl.
| | |
|---|---|
| *H01L 31/18* | (2006.01) |
| *H02S 20/25* | (2014.01) |
| *B65H 29/24* | (2006.01) |
| *H01L 31/048* | (2014.01) |
| *H01L 31/05* | (2014.01) |

(52) U.S. Cl.
CPC ......... *H01L 31/186* (2013.01); *B65H 29/242* (2013.01); *H01L 31/048* (2013.01); *H01L 31/0508* (2013.01); *H02S 20/25* (2014.12)

(58) Field of Classification Search
None
See application file for complete search history.

(56) References Cited

U.S. PATENT DOCUMENTS

| | | | |
|---|---|---|---|
| 2003/0121228 A1 | 7/2003 | Stoehr et al. | |
| 2011/0239450 A1* | 10/2011 | Basol | H01L 31/048 29/738 |
| 2012/0325282 A1* | 12/2012 | Snow | H01L 31/022425 136/244 |
| 2016/0099365 A1* | 4/2016 | Luch | H01L 31/02008 136/256 |
| 2016/0163914 A1 | 6/2016 | Gonzalez et al. | |
| 2020/0381577 A1* | 12/2020 | Zhou | H02S 50/10 |

FOREIGN PATENT DOCUMENTS

| | | |
|---|---|---|
| EP | 2139050 A2 | 12/2009 |
| EP | 2917942 A1 | 9/2015 |
| EP | 3090449 A1 | 11/2016 |
| IT | TV2017A084020 A1 | 1/2019 |
| WO | 2011071373 A1 | 6/2011 |
| WO | 2017190800 A1 | 11/2017 |

* cited by examiner

Primary Examiner — Jay C Chang

(57) ABSTRACT

An assembly method and a combined and bivalent workstation for automatically assembling photovoltaic panels, with printing of ECA on cell portions and progressive arrangement with a partial superimposition on the contacts, pre-forming shingled strings in a continuous cycle, which are ready for loading on a backsheet, without dry-curing. The method provides a macro-phase of lay-up entirely made in the station, with simultaneous and coordinated sub-phases: picking of portions with a first handler and control, oriented loading on a vacuum belt, control of positioning on the belt, printing of ECA, control of printing and positioning, progressive superimpositions on a shuttle-tray with bidirectional translation coordinated with a second handler with chocked vacuum, picking of the shingled string with a third handler, control of string alignment, loading and pre-fixing. Vision systems are integrated for the execution of said sub-phases.

8 Claims, 7 Drawing Sheets

ASSEMBLY METHOD AND COMBINED BIVALENT STATION FOR PHOTOVOLTAIC PANELS

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

Field of the Invention

This invention relates to an assembly method and to a combined and bivalent workstation for photovoltaic panels.

Description of Related Art Including Information Disclosed Under 37 CFR 1.97 and 37 CFR 1.98

The proposed solution finds particular application in the industrial sector of the production of photovoltaic panels, with specific reference to modern photovoltaic panels with cells in crystalline silicon mounted on a backsheet; there are provided diversified functions, but integrated to each other in such a way as to operate in a continuous cycle with high productivity, precision and versatility of use. In particular, the method and the combined station that are object of the invention allow to make, in an advantageous way, photovoltaic panels with cells or cell portions of the traditional type with top-bottom contacts, namely with the negative and positive electrical contacts placed on opposite faces of same cell, wherein said cells or cell portions are printed and immediately interconnected by strings in a manner called shingled, namely with a partial superimposition on the contacts, ready to be loaded on a backsheet without intermediate drying of the conductive adhesive. Furthermore, the invention allows, with the same apparatus, to make panels with entire cells of the back-contact type, that is only with back contacts such as in the MWT, EWT, IBC typologies, or other equivalents, wherein said cells are loaded adjacent one another without superimposition on a backsheet of conductive type.

In principle, with respect to the known art, an operative macro-phase is proposed, wherein strings are pre-formed in a continuous cycle in a line dedicated to this aim and integrated near the printing, picking and progressively placing, from the top, with extreme precision and rapidity, each cell or cell portion, as soon as printed, and coordinating the action of a mobile support with the action of a particular gripping and releasing means. In this way, it is possible to make any configuration of string, ready to be loaded on the backsheet in transit; however, the advantages obtained when producing the particular strings called shingled are apparent to the skilled man, therefore the following description of the invention does reference to the assembly of panels with this shingled strings architecture, wherein the automatic apparatus of pre-formation of the strings firstly prints a conductive adhesive directly on each cell, or cell portions, and thereupon pre-arranges them by complete strings, made up of cells or cell portions that are partially superimposed one another in correspondence of the electrical contacts. In the description, such a multifunction apparatus is therefore conventionally called shingling apparatus; for the purpose of the invention, it is made in such a way as to functionally and structurally integrate with the automatic apparatus that simultaneously loads and pre-fixes the newly formed shingled string on a backsheet, in the same workstation conventionally called combined lay-up station.

Moreover, it should be noticed that the proposed invention allows to advantageously preform said shingled strings, but also to handle adjacent back-contact cells, in such a way as to load and immediately pre-fix them on a particular backsheet, producing different types of panels with the same machinery. The method and the combined station provided by the invention, therefore, follow a bivalent logic of use that allows extreme versatility and rapidity in conforming to the multiple needs of the market, without additional investments for new plants and with minimal overall dimension of the equipment.

With this invention, the industrial production of photovoltaic panels with superimposed or shingled cell portions is particularly improved, thus solving the typical assembly problems that are widely known to the operators of the sector; by way of example, it is possible to avoid the conventional intermediate drying of the conductive adhesive, or dry-curing, also in shingled strings, in general handling operations are reduced and the final phase of contacting between adjacent strings, or bussing, becomes easier. The method and the apparatus provided by this invention integrate in a modern production process for automatic plants with workstations placed in sequence, achieving a sensible reduction of production times and costs. Furthermore, the invention provides equipment that offer an extreme versatility of use and reduce the overall dimension, thus limiting overhead costs for investment and also the times to start the production of a new product.

In principle, the solution proposed follows an integrated assembly logic of the type called Cell-To-Module, wherein the entire panel is composed starting from a cell or a cell portion. More in detail, it is intended to assemble panels with said cells or cell portions of the traditional type, namely with top-bottom contacts, particularly superimposed one another, namely arranged in shingled strings, in such a way as to obtain, in production, the same advantages reached by the most evolved systems of automatic assembly for panels with adjacent back-contact cells, as in the known prior art e.g. in EP2917942 (Baccini et al.), EP3090449 (Baccini et al.) or ITTV2017A084020 (Baccini et al.).

Nowadays, in fact, the industrial advantages offered by the modern cells of the back-contact type with back contacts only are widely known, which are directly mounted on a backsheet of the conductive type, as compared to the traditional systems with top-bottom contact cells involving electrical connection elements between the opposite faces of adjacent cells. More in constructive detail, a modern panel of the back-contact type is made up as follows:

a conductive backsheet supporting the cells at the back and also electrically connecting them;

photovoltaic cells with both positive and negative electric polarity contacts placed on the back, i.e. the rear side of the cell;

a conductive material interposed between said conductive backsheet and the back faces of the cells, in correspondence of the contacts of the same cells that have different electric polarity, being for example of the type called Electronic Conductive Adhesive or with the acronym ECA, or of the solder paste type or other equivalent materials; such material, being generally applied with a dropwise dispenser, for silkscreen printing or with a system of the ink-jetting type or with other equivalent solutions of laying;

two layers of encapsulating material, generally Ethyl Vinyl Acetate called with the acronym EVA, intended to enclose and frontally and rearward protect the cells and some components of the panel;

an insulating or dielectric material superimposed on the conductive backsheet, with openings at the areas in contact with the back polarities of said cells;

a flat glass, a frame and a connection box.

Is also known an advantageous solution of conductive multi-layer backsheet for back-contact cells, conventionally called BCBS with an English acronym, which already includes said perforated encapsulating back layer and said dielectric layer; see, for example, the solutions described in EP2917942 (Baccini et al.) or EP3090449 (Baccini et al.) for automatically assembling photovoltaic panels with said back-contact cells.

Furthermore, it has been found that the above-mentioned panels with back-contact architecture, although they allow a high automation degree during assembly and high productivity, are poorly widespread due to the higher cost of the cells compared to traditional solutions, and to the high investment costs in automatic productive lines, which are very efficient but little versatile. Such plants, in fact, are specific for a product typology or dedicated to a particular embodiment called "back-contact", according to a specific project, with high production volumes and high repeatability, and therefore do not allow to produce panels having different architectures. Substantially, a modern automatic plant for assembling back-contact cells does not allow to assemble traditional cells, as the product is structured in a different way and not easy to handle with mechanical means. Consider, in particular, the electrical interconnection of adjacent cells: in one case, it is made by a simple positioning on said conductive backsheet, while in the other case is made by applying conductive tapes between the cells, that is top-bottom.

Nowadays, in the sector of photovoltaic industry, there is still a high request for panels with cells of the traditional type, with top-bottom contacting, as they are more widely spread and therefore have a lower cost. The use of top-bottom contact cells involves higher assembly costs, but lower investments in equipment, as they are typically slightly automated. Particularly, among the typical problems of said traditional cells, we shall remind the complexity of the process and the poor reliability in making the top-bottom connections of the opposite poles between adjacent cells, also called wiring, with a non-constant quality of the finished product and with high production costs and frequent re-processing in the case of high volumes. As a result, there is a need for new methods and assembly plants for photovoltaic panels with traditional cells, which allow their production in a fast and economical way, in a continuous cycle, with a high degree of repeatability and of industrial automation, similarly to what already occurs in the production of the above-mentioned panels with back-contact cells.

Furthermore, it has also been found that the known systems for making panels with top-bottom contact cells are technically different than those which are suitable to produce panels with back-contact cells only, thus limiting the competitiveness of the companies operating in this sector. Basically, it has been found that the methods and the equipment to produce modern back-contact panels do not allow to make panels with traditional cells, and vice-versa, while is desirable, nowadays, to have a greater versatility for the purpose of rapidly and economically adapting to market demands.

Recently, we also have witnessed the diffusion of an innovative and advantageous technical solution of interconnection for said cells of traditional type or portions of said cells, wherein the top-bottom contacting between two adjacent cells occurs directly, without the use of conductive tapes, by means of a partial superimposition at the opposite poles, like roof tiles; such a solution, in fact, it is commonly called shingled. Panels with shingled cells, in fact, are often required due to their improved connection logic compared to the conventional solutions, and above all due to the increase of the specific power of the panel per surface unit and therefore of energy produced for square metre of occupation; substantially, efficiency and total productivity are considerably improved, the front shading of the cell is reduced and losses called Cell-To-Module Loss in English language are limited too, improving the aesthetic aspect of the finished product as well.

It has been found that such an interconnection of adjacent elements by partial superimposition, offers greater advantages in the direct contacting between cells inside the same panel, in order to form complete strings having a full height, adjacent one another, which are then electrically interconnected at the head applying conductive elements according to a conventional bussing operation.

In particular, in order to electrically connect the opposite poles, in the area of superimposition between cells, generally a conductive adhesive is used, or ECA with an English acronym, in such a way as to avoid to weld the conductive tapes, or ribbons, on the surface of each cell. This elimination is advantageous as it simultaneously allows to solve some production problems making the panel assembly method less rigid and more versatile, and also improving its embodiment. In particular, for the purpose of the invention, by eliminating the conductive tapes that are used for the electrical top-bottom contacting between cells, it is possible to considerably increasing the general degree of automation during the assembly process of the panel, with a greater repeatability and with lower cracks or rejects, thus considerably reducing production costs.

Nowadays, the market offers some high-efficiency photovoltaic panels bases on said interconnection with a partial superimposition of portions or cell slices; by way of example only, see the widespread modules commercially called P-series™ of the American company SunPower Corporation—https://us.sunpower.com, or those called Eclipse™ of the Chinese company Jiangsu Seraphim Solar System Co. Ltd—www.seraphim-energy.com.

In general, therefore, several advantages are known for said solution with shingled cells; among them, a better exploitation of the exposed surface of the photovoltaic panel, with a more extended active area under the same overall dimension of the panel. From a productive point of view, to this end, the most evolved technique envisages to mount cells that have been conveniently pre-cut into slices called portions, like rectangular bands having a side with a lower length relative to the broadside, which generally corresponds to the side of a traditional square cell of 6 inches. More in detail, from a single cell, we obtain from 2 to 6 identical portions, preferably 4 portions or 5 or 6, which are then partially superimposed on the broadside during the phase of assembly of the panel, also called lay-up, performing a cascade electrical interconnection of an entire string. In this way, compared to the traditional technique, the number of the low-size generators increases and therefore the interconnections increase, but also transported currents are considerably reduced in such a way as to advantageously limit the aforementioned losses called Cell-To-Module Loss.

Consequently, with the increase of the interconnections, it is necessary to provide an improved system for laying conductive adhesive on the contacts of each portion of traditional cell, that is faster, more precise and economic compared to the conventional dropwise distribution. It is also important to simplify the entire assembly process that nowadays comprises an intermediate drying phase that limits to much the operative flow, heavily limiting the production time, the layout of the plant and the industrial costs. Furthermore, there is a need for an improved system to charge said cells or cell portions on a backsheet, with a greater rapidity, implementation and safety compared to the conventional and known solutions with a partial superimposition. The method and the equipment proposed by this invention allow to obtain these and other advantages, which are set forth in detail in the following description.

Prior Art

In order to determine the prior art related to the proposed solution, a conventional check in patent literature has been carried out by searching public archives, which lead to the identification of some prior art, among them:

D1: US20030121228 (Stoehr et al.)
D2: WO2017190800 (Gislon et al.)
D3: US20160163914 (Gonzalez et al.)
D4: EP2139050 (Bakker et al.)
D5: WO2011071373 (Bakker et al.)
D6: EP2917942 (Baccini et al.)
D7: EP3090449 (Baccini et al.)
D8: ITTV2017A084020 (Baccini et al.)

D1 describes a typical solution with direct interconnection of traditional cells with a partial superimposition as roof tiles, or shingled, with conductive adhesive on the opposed contacts of each cell, without conventional conductive elements for back-front interconnection acting as rails wherein the electric current is channeled.

D2 proposes a system to automatically produce at least two strings with superimposed traditional cells, wherein first the cells are cut into slices by laser means, then conductive adhesive is laid on each cell at all the contacts, then the cell is picked up separating the slices to translate them sideways and separately lay them on the same number of conveyor belts that are placed parallel, onto which the different slices of each cell will then be progressively superimposed; the strings so formed undergo then a separate phase of infrared rays heating, suitable to harden the adhesive, both mechanically and electrically consolidating the structure of the string in such a way as to pick it then up and afterwards use it for making a photovoltaic panel.

D3 describes a production system for strings, wherein the cells are initially positioned on a conveyor belt, in order to pass through a modular station with laser, wherein they are etched to a predefined depth, and a station wherein a predefined quantity of conductive paste is supplied; therefore, in a station, the cells are divided into smaller slices to then be superimposed like roof tiles, by strings, with a specific module intended for the transfer and superimposition of the cells, such as a pneumatic handler with mobile heads type, which picks up said cell slices together and during the transfer places them near one another at different heights, partially superimposing them on the contacts, in order to lay them in groups and already superimposed. Later, the paste is hardened in a station in such a way as to make it possible to transfer the string so formed on a backsheet.

D4, instead, proposes an assembly process for panels with back-contact cells starting from a conductive backsheet, onto which first a conductive material is placed and then a perforated encapsulating layer is superimposed, making the holes matching with said conductive material; then, the cells, the upper encapsulating layer and the glass are laid and then conveyed to the end rolling.

D5 describes a process similar to D4, but with an enhanced stability to allow for handling and overturning operations without relative slips among the components; in particular, a softening phase is proposed, by partial melting of the thermoplastic layers placed at the top and at the bottom of the cells, substantially performing a pre-rolling of the assembled layers.

D6 proposes a fully automatic process for assembling panels with back-contact cells starting from a particular conductive backsheet with an integrated encapsulating and dielectric layer, conventionally called BCBS, and made separately, which allows to make an innovative and advantageous structure of photovoltaic panel, with a greater production quality and lower industrial costs. Said BCBS is made up of a double encapsulating layer with an interposed dielectric layer, which is perforated and joined to the conductive sheet of the support backsheet; on said BCBS horizontally placed on a tray with the conductive layer facing upwards and with the contacting areas of the cells already masked, it is then possible to directly and automatically lay a conductive material as ECA, with distribution of the type called dropwise or jet dispensing; then the cells, the upper encapsulating layer and the glass are laid and then the panel is overturned and undergoes the end rolling. Prior to overturning, the invention also provides the use of a selective heating source allowing the encapsulating layers to stick one another in specific areas to allow for the overturning without displacements or relative detachments of the components.

D7 proposes an improved variant of the previous process, wherein the loading of the cells is carried out in combination to their pre-fixing, in the same combined station, which is sequentially placed before the station where the upper encapsulating layer is superimposed and after the station where the conductive adhesive is laid on the contacting holes. In said combined station, a first device of the automatic handling type picks up said cells, aligns them with the back contacts at said contacting holes and lays them vertically from the top, handling them in a Cartesian portal, and simultaneously a second device of the presser-heater type performs said pre-fixing of the cells holding them in their final position and applying localised heating on at least one portion of each cell, in such a way as to activate the adhesive function of the underlying thermoplastic encapsulating layer in specific and predefined areas.

D8 describes another improvement of D6 and D7, that resolves inherent difficulties in laying the conductive material inside the contacting holes of the rear encapsulating layer, and also resolves the execution difficulties found in the conventional solutions for printing on cells, thus reducing the rejects and considerably simplifying the production. In particular, there is provided to assemble the panel starting from the back side, printing the ECA on the cells placed with their front downwardly and therefore with the contacts upwardly, automatically controlling this laying with a special vision system from the top and immediately overturning them in such a way to pick and charge them on a backsheet from the top, that is with the contacts facing downwards; such operations are carried out with an automated gripping and control apparatus that rotates and translates in a Cartesian portal in such a way as to facilitate the centering of the contacting points of the cell and allow, by means of the same or another Cartesian portal, for the immediate pre-fixing of the cells in order of prevent any translation or rotation after said laying. By way of example, see the table of the known prior art (FIG. 1).

In conclusion, it is reasonable to consider as known:
- a rear backsheet of the single or multi-layer type, for traditional cells;
- a conductive backsheet of the multi-layer type, for back-contact cells, with dielectric layer and possible encapsulating layer;
- the laying of adhesive or conductive paste on contacting points of the backsheet or the cells, by means of dropwise distribution or silkscreen printing;
- an assembly system for panels with top-bottom contact cells connected with a partial superimposition, that is shingled, with conductive adhesive interposed on the contacts, wherein two consecutive and different macro-phases are provided: one to make the complete strings, that is Cell-To-String, and one to load them on the backsheet, that is String-To-Module, an intermediate drying phase of the conductive adhesive, or dry-curing, being required;
- an automatic assembly system for panels with back-contact cells, starting from said conductive backsheet with dielectric and encapsulating layers, and laying conductive adhesive on the contacting holes of the encapsulating and dielectric layer, onto which then said cells are loaded;
- an automatic assembly system for panels with back-contact cells, with Cell-To-Module integrated logic, with an advantageous and combined phase of printing, loading and simultaneous pre-fixing of said cells on said multi-layer backsheet, which is carried out in a combined workstation of the compact type, wherein the ECA is printed on the cells placed with the contacts facing upwards, with a control from the top by means of a vision system, and immediately overturning them in such a way as to load them from the top, that is with the contacts facing downwards, by means of an automated picking and control apparatus that rotates and translates in a Cartesian portal, wherein the cells are also pre-fixed to the encapsulating layer in order to convey them to the rolling apparatus.

Drawbacks

In conclusion, we have observed that the known described solutions have drawbacks or anyway some limits.

In general, we have found that the known and conventional processes for assembling photovoltaic panels with top-bottom contact cells still have a somewhat limited automation degree, with some manual operations and visual controls. It is for example known the problem of laying minimum and controlled quantities of ECA in specific positions on the surface of the cell, which requires a high precision level and accuracy; for the purpose of the invention, given the need to carry out such an operation with high productive volumes and absolute precision, in said case of panels with shingled cells, it is required a higher degree of automation and automatic control compared to the conventional solutions for top-bottom contacting.

Moreover, it has been found that all the known solutions to produce panels with interconnected cells in shingled form, as for example in D1, D2 or D3, provide said two separate macro-phases: more in detail, in the first macro-phase, the single strings of cells or cell portions are made, to go then to a second macro-phase of assembly where said strings are mounted on the backsheet and interconnected, soldering them at the head and tail to the conductive members applied that are called cross ribbon and bus-ribbon, in such a way as to compose the photovoltaic panel in its final configuration. In particular, before going to said second macro-phase, in order to be able to handle said strings, it is inevitably provided an intermediate phase of hardening, that is drying of the conductive adhesive, therefore a stay period is required or at least the transit of the single strings in a furnace, a tunnel or a hardening station. Such a method involves multiple problems, as set forth in the following.

Firstly, in said methods it has been found the problem of having to handle the strings as soon as they are made, with a high difficulty degree in the execution and a high percentage of rejects; in fact, it is known that the handling of a string of adjacent cells or portions partially superimposed like roof tiles, where the conductive adhesive is already hardened e.g. in D1-D5, considerably increases the risk of cracks and/or electrical disconnection among the cells or portions of cells.

Secondly, it has been found that a plant where the strings of cells are assembled by separated operating phases, or anyway non-simultaneously and/or not integrated and/or not combined, as for example in D1-D3 in the case of strings with superimposed traditional cells, or in D4-D5 in the case of back-contact cells, is generally long and complex to implement correctly, as for example in D1-D5.

Thirdly, it has also been found that the above-mentioned plants, where the assembly provides separate operating phases, occupy a greater space compared to the modern compact and integrated plants for making back-contact panels with combined workstations, such as in D7, D8, D9.

Fourthly, it has been found the difficulty of introducing furnaces for said intermediate drying in an automated assembly process.

Fifthly, in the modern methods for assembling shingled cell panels, as for example in D2-D3, it has been found an excessive rigidity in the composition of the module. More in operative detail, said processes with two macro-phases with an intermediate drying, overly limit the second macro-phase called String-To-Module, substantially freezing the end configuration of the panel; by way of example, consider to the number and the exact dimension of the strings, the number of diodes, the overall dimension of the finished product, where the consequent automation is forcedly destined to a single and particular configuration of panel, resulting from the strings of said first sub-phase. Among the known solutions, in fact, it is not available, though it being highly desirable, a method and an apparatus for automatically assembling photovoltaic panels with shingled cells in a single macro-phase, with an integrated logic of the type Cell-To-Module, likewise to what already occurs in the modern panels of the back-contact type in the automated solutions as in D6, D7 or D8; in particular, it is necessary to avoid the above-mentioned hardening problems of the ECA adhesive and of handling of the single strings, allowing also a greater degree of freedom in the composition of the module.

We have experimentally observed the advantages in production offered by a modern automatic system for assembling panels with back-contact cells, on a multi-layer conductive backsheet of said BCBS type, as for example in D6, D7 or D8; for example, it is advantageous an automatic workstation wherein cells are loaded and simultaneously pre-fixed, such as in D7, or even it is advantageous the printing of conductive material on the cell by means of a combined station as in D8. However, the known methods for back-contact cells do not allow to assemble panels with cells or cell portions of the traditional type, with top-bottom contacts, connected with a partial superimposition on said contacts in order to form shingled strings; in particular, in said integrated systems of the Cell-To-Module type, it is not known how to print and progressively superimpose portions of cell in such a way as to form complete and already electrically contacted strings in a continuous cycle, which are ready to be handled and positioned on a non-conductive backsheet, without intermediate drying of the ECA adhesive, simultaneously and in a continuous cycle. Therefore, it is not known, although it is desirable, an integrated and multifunction equipment suitable to form the aforementioned shingled strings starting from cell portions, in such a way as to pick them up and immediately position them on a backsheet in transit, without dry-curing.

Given the above, nowadays, it is not available, and is widely required in the photovoltaic sector, a greater versatility of use of the plants, in order to reduce investment costs, spaces required and set-up time. Particularly, they are not available, and are desirable, methods and automatic equipment of the bivalent type, that is allowing a double use, to assemble with high productivity and repeatability both panels with cells or cell portions of traditional type, connected in shingled form with a partial superimposition on the contacts, and panels with adjacent back-contact cells. More in detail, there is a need for an innovative automatic assembly method and for a combined workstation suitable to implement it, which is extremely compact in size and versatile in the use, suitable to pre-arrange complete and already contacted shingled strings in a continuous cycle, starting from top-bottom contact cells, which possibly also allows to assemble panels with adjacent back-contact cells on a conductive backsheet. In particular, is not known how to make complete shingled strings in a continuous cycle, which are ready to be immediately loaded on a backsheet with encapsulating layer, simultaneously operating, in the same workstation, with automatic equipment operating in a combined way, that is integrated one another. Moreover, is not known how to handle the shingled string being just formed eliminating the conventional intermediate phase of hardening the ECA conductive adhesive, called dry-curing, to rapidly go to the following workstation wherein, for example, the contacting between strings are made, called bussing.

Hence, the need for enterprises of the sector to identify solutions that are more effective compared to the existing solutions; the aim of this invention is also to avoid to the described drawbacks.

BRIEF SUMMARY OF THE INVENTION

This and other aims are achieved with this invention according to the characteristics as set forth in the attached claims, thus solving the problems described by an assembly method (10) and a combined and bivalent workstation (S2) for automatically assembling photovoltaic panels, with printing of ECA on cell portions and progressive arrangement with a partial superimposition on the contacts, pre-forming shingled strings (402) in a continuous cycle, which are ready to be loaded on a backsheet, without dry-curing. The method (10) provides a macro-phase of lay-up (11) entirely made in said station (S2), with simultaneous and coordinated sub-phases (11.1 11.9): picking (11.1) of portions with a first handler (R1$a$-R1$b$) and control, oriented loading on a vacuum belt (11.2), control of the position on the belt (11.3), printing of ECA (11.4), control of printing and position (11.5), progressive superimpositions (11.6) on a shuttle-tray (210) with bi-directional translation, coordinated to a second handler (R2) with chocked vacuum, picking of shingled string (11.7) with a third handler (R3), control of string alignment (11.8), loading and pre-fixing (11.9). Vision systems (V1, V2, V3) are integrated for the execution of said sub-phases.

Aims

In this way, by the considerable creative contribution whose effect has allowed to reach a considerable technical progress, some aims and advantages solving the main above-mentioned problems are achieved.

A first aim has been to make available a method and an apparatus that allow to pre-arrange, in a fully automatic way and in a continuous cycle, complete strings made with printed cells or cell portions and immediately superimposed like roof tiles, being conventionally called shingled strings in this invention, which are already ready to be loaded and prefixed on a backsheet provided with lower encapsulating layer, in the same compact and integrated workstation, thus considerably improving the industrial production of photovoltaic panels with traditional cells. In particular, the proposed solution allows to avoid the separate phase of dry-curing, not being necessary the intermediate drying of said shingled strings that are interconnected on the superposition between cells and handled without relative movements by continuously holding each single cell and/or cell portion during each top-bottom operative phase, that is during production, but also during the transport and up to the loading and pre-fixing. In this way, it is possible to produce a photovoltaic panel starting from cells or portions of cells of the traditional type, with top-bottom contacts, according to the integrated assembly logic called Cell-To-Module that, in principle, derives from the known solutions for back-contact cells only, as for example in D6, D7 or D8, which however do not provide and do not allow the superimposition on said contacts.

A second aim has been that of making shingled strings that are, in turn, alternated in the direction of superimposition in order to allow a continuous production and also to facilitate the head-tail connection between adjacent strings, thus reducing the length and/or the complexity of the conductive elements that are applied in the following bussing phase.

A third aim has been that of progressively performing said superimpositions between formed cells, in an extremely fast and economical manner, and with a very high degree of precision; moreover, said superimposition is carried out shortly after the printing of the ECA on each cell, occupying an area very limited near the printer.

A fourth aim has been that of producing panels with shingled cells limiting the overturning of the cells just being printed, that is leaving the ECA adhesive facing upwards; furthermore, translations and possibilities of errors and/or misalignment between cells are minimized.

A fifth aim has been that of reducing the industrial costs for assembling a photovoltaic panel with traditional cells.

A sixth aim has been that of allowing, with the same method and the same plant provided by the invention, an easy assembly even of a panel of the glass/glass type.

One more aim of the invention, resulting from said first aim, has been that of making available a very versatile method and assembly apparatus, that is adaptable to different configurations of photovoltaic panel, being especially suited for traditional and superimposed or shingled cells, but also suitable for not-superimposed back-contact cells, thus obtaining a considerable saving on the investments and on the occupied spaces, with also a greater supply speed and a lower cost of the finished product. Particularly, the proposed solution changes and improves said integrated macro-phase of printing, loading and pre-fixing as in D8 in the known prior art, and the automatic apparatus that makes it, in such a way as to advantageously allow the use of said traditional interconnected cells with partial superimposition. An aim of this invention, therefore, has been that of making the assembly of photovoltaic panels with said shingled cells considerably faster, but even more solid, repeatable and safe from the point of view of the industrial process, with considerable progress and utility.

These and other advantages will appear from the following detailed description of some preferred embodiments, with reference to the schematic drawings attached, whose execution details are not intended to be limitative, but only illustrative.

DESCRIPTION OF AT LEAST ONE EMBODIMENT OF THE INVENTION

Figure 1:
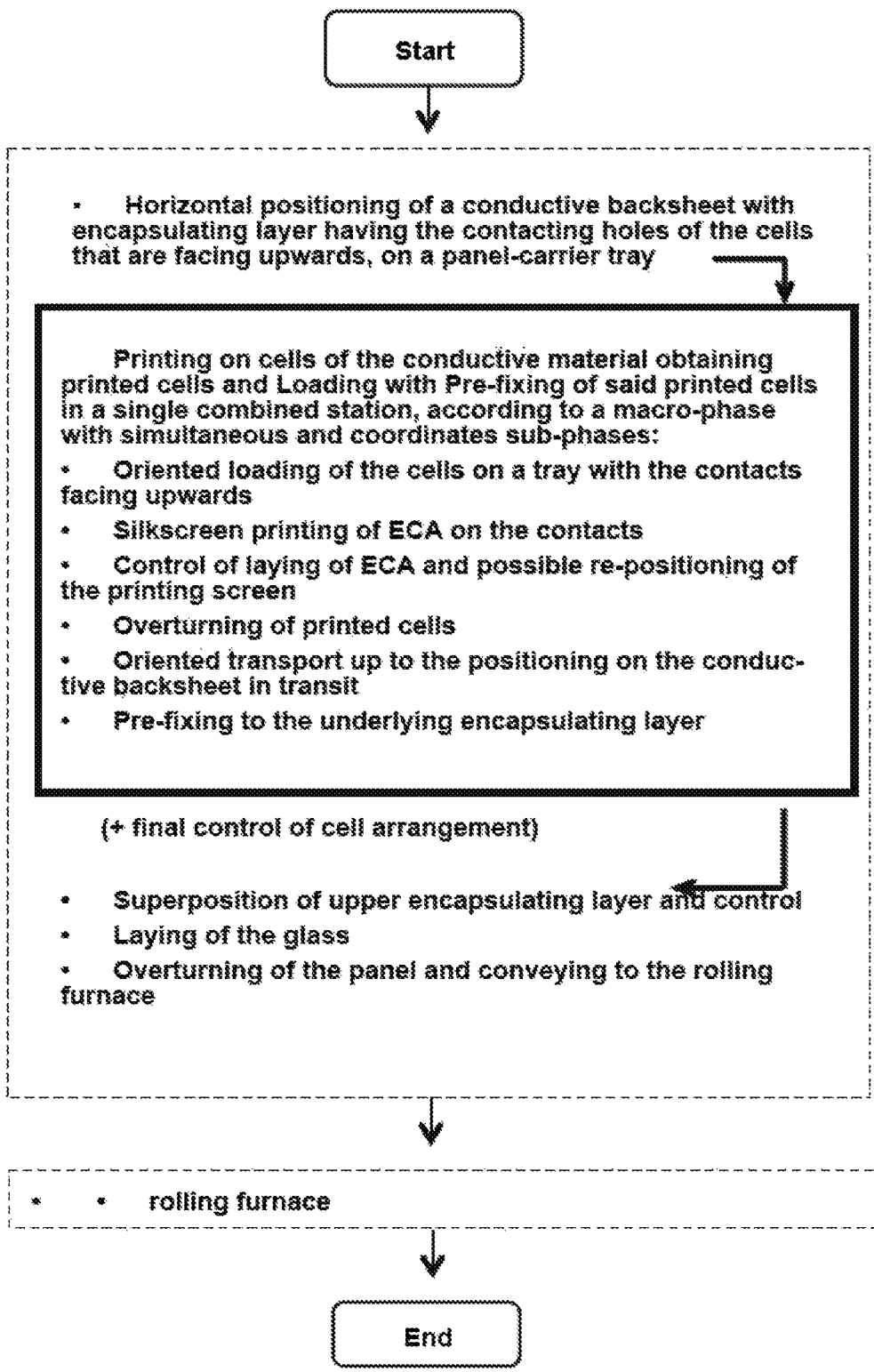
FIG. 1 schematically shows the assembly method of a photovoltaic panel with back-contact architecture according to the known art, as for example in ITTV2017A084020 (Baccini et al.), called D8 in the above-mentioned description of the prior art, wherein the laying of said ECA is combined to the loading with pre-fixing of the cells, silkscreen printing the conductive material on the contacts of the cell facing upwards and immediately loading the printed cells according to a single macro-phase of cell printing, loading and pre-fixing, which provides six simultaneous operative and coordinated sub-phases: oriented loading, printing, control, overturning, positioning and pre-fixing of the cell on the encapsulating layer with localised heating.
Figure 2:
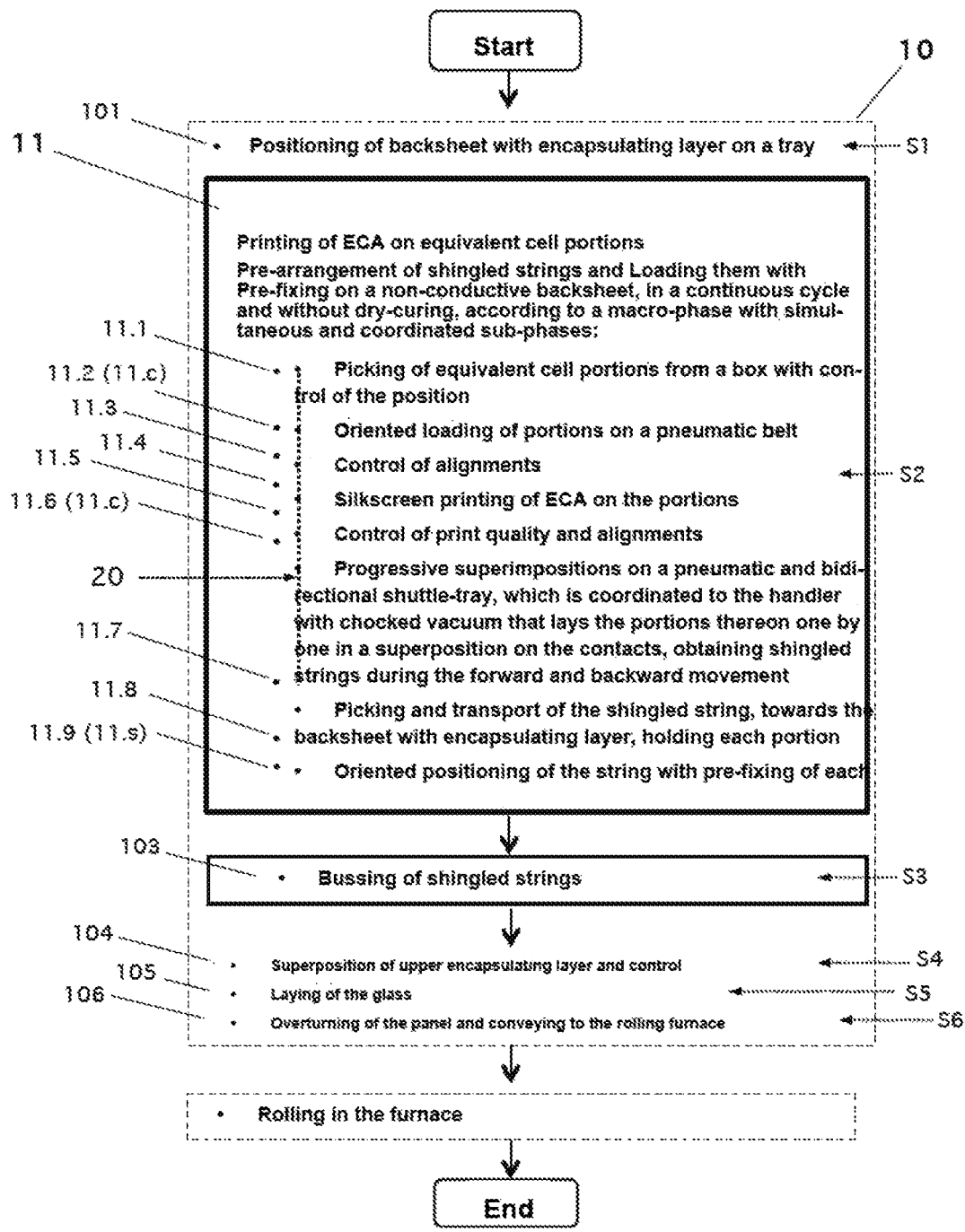
FIG. 2 schematically illustrates the assembly method proposed by the invention, relating to a photovoltaic panel with cells or equivalent cell portions of traditional type, interconnected with a partial superimposition on the contacts, namely shingled, according to a single macro-phase of printing (11), pre-arrangement of complete shingled strings on a shuttle-tray with bi-directional translation, picking with loading and pre-fixing of the strings, according to nine main operative sub-phases (11.1 11.9) that are simultaneous and coordinated one another, with possible reject of non-conform cells or strings (11.c, 11.S).
Figure 3:
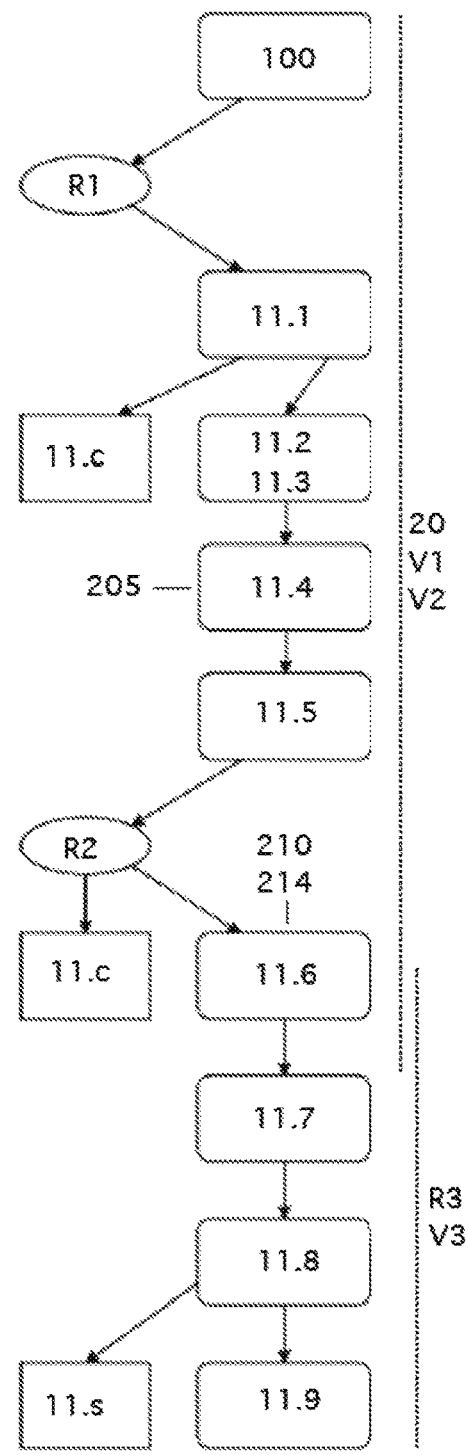
FIG. 3 is a flow-like schematic illustration of said macro-phase (11), wherein a particular automatic apparatus (20) allows to pre-arrange said alternated shingled strings, which are ready to be immediately loaded and pre-fixed on the backsheet (R3), in the same workstation (S2).
Figure 4A:
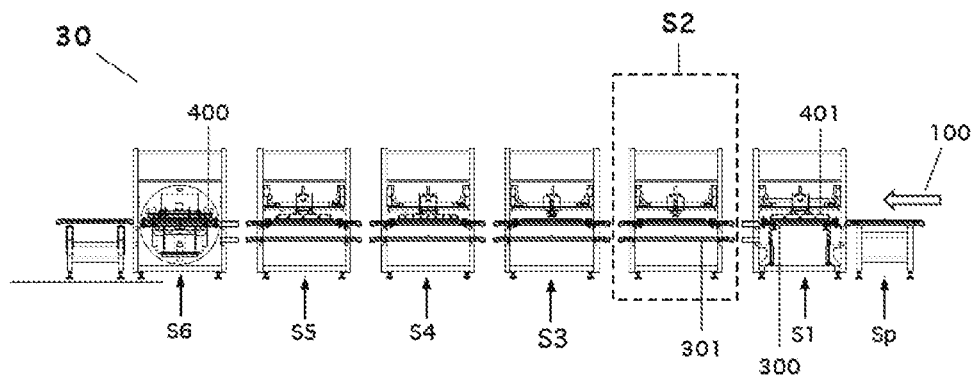
FIGS. 4a and 4b are orthogonal views of the automatic plant object of the invention, respectively in X-X longitudinal section (FIG. 4a) and in plan (FIG. 4b), wherein the combined station (S2) where said macro-phase (11) is executed is enclosed by a dashed box, as in the following FIGS. 5a and 5b.
Figure 4B:
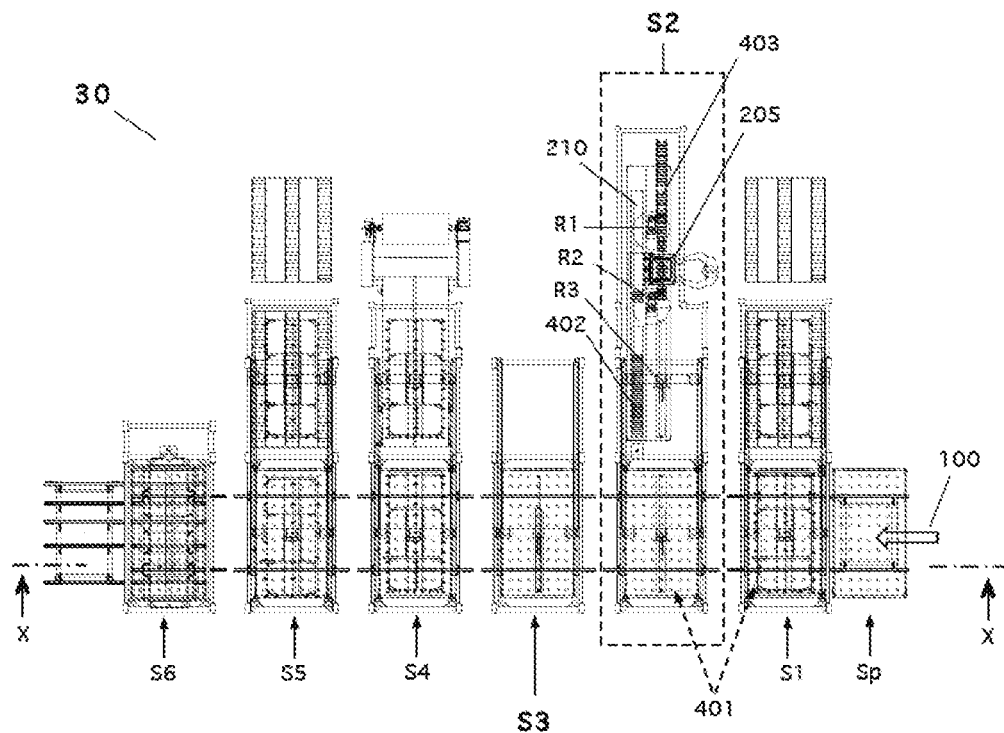
Figure 5A:
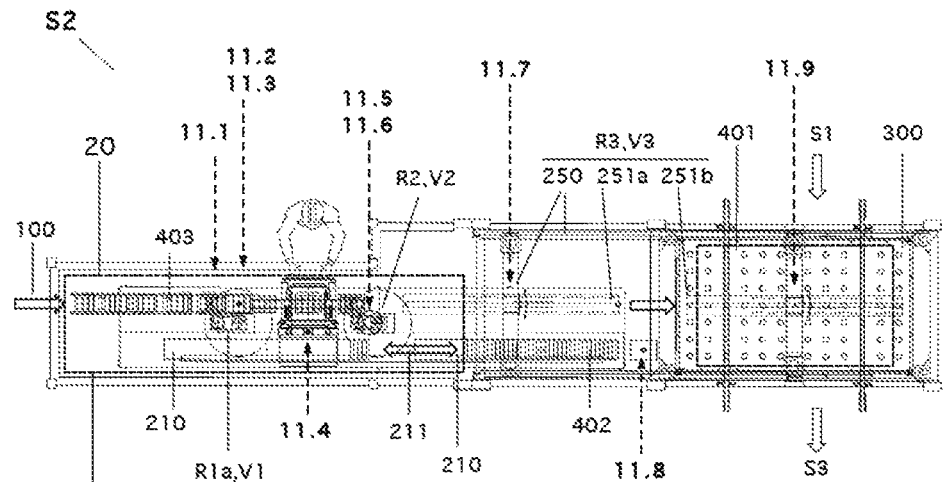
FIGS. 5a and 5b are plan views of said combined and bivalent station (S2) object of this invention, respectively an overall view (FIG. 5a) and an enlarged detailed view (FIG. 5b), in the dashed box, which refers to the automatic shingling apparatus (20) suitable to print cell portions and immediately pre-arrange them with a partial superimposition for forming shingled strings, which are ready to be loaded and pre-arranged on a backsheet in transit in the same combined station that operates in a continuous cycle and in an integrated way. It is shown a basic embodiment with a single path for loading the cells, or equivalent cell portions, and a single shuttle-tray for forming the string.
Figure 5B:
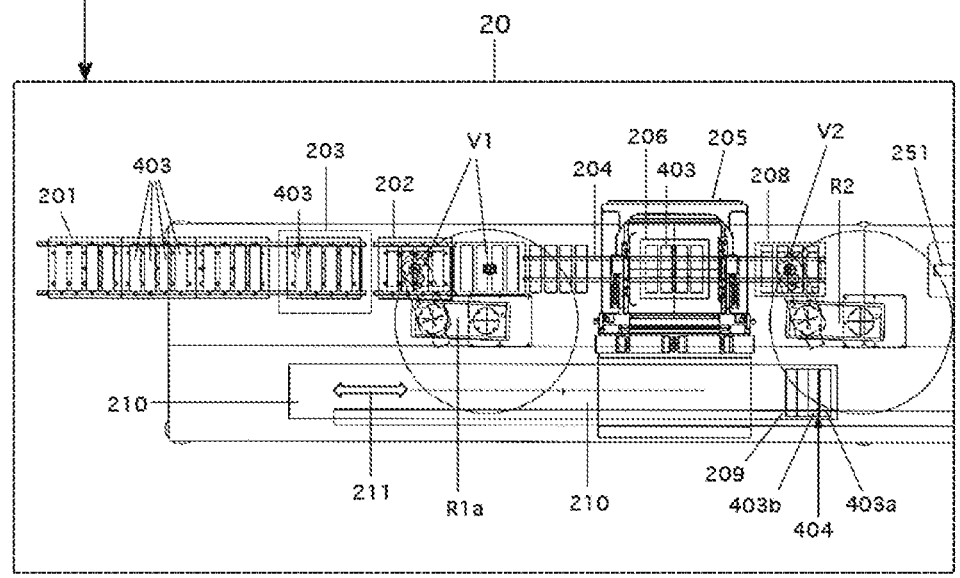

With reference also to the figures (FIGS. 2-9b), a method (10) is described, which comprises a macro-phase (11) for advantageously assembling photovoltaic panels (400) with crystalline silicon solar cells of the traditional type with top-bottom contacting, or cell portions that are identical one another (403a-403d), wherein said cells or portions are partially superimposed (404) like roof tiles for direct contacting, namely in the form called shingled. In particular, there is provided to print ECA on said cells or portions (403) and immediately pre-arrange them in a progressively superimposed way by forming shingled strings (402) in turn alternated in the direction of the head, with a particular operative logic (11.1 11.6) and with a particular automatic shingling apparatus (20) (FIGS. 5a-5b, 9a-9b), wherein said shingled strings (402) are pre-arrange and ready to be immediately loaded and pre-fixed (R3) on a backsheet provided with an encapsulating layer (401) (11.7 11.9), operating in the same workstation (S2) in a continuous cycle and without intermediate drying of the conductive adhesive.

Said pre-arrangement of shingled strings (11.1 11.6) and said loading with pre-fixing (11.7 11.9) occur simultaneously in a workstation (S2), wherein the automatic shingling apparatus (20, R1-R2, V1-V2) is integrated with the loading and pre-fixing apparatus (R3, V3) thanks to an innovative tray machine made up of a pneumatic shuttle-tray (210) with bi-directional translation, coordinated to a particular handler (R2). Said station (S2), being in its turn integrated in a production plant (30) sequentially made up of at least six workstations (S1-S6), wherein the entire photovoltaic panel (400), ready to be conveyed to end rolling, is assembled by progressive stratification, on a panel carrier tray (300) in transit. Said automatic station (S2), of the type combined in the means and in the functions, and bivalent in the use for assembling, if necessary, cells without superimposition, as it is described in detail in the following.

The proposed invention (10, 11, 20, 30, S2) provides that the assembly of the photovoltaic panel with superimposed cells, that is shingled, is made simultaneously, without the conventional separate formation of the strings with intermediate drying of the ECA, but integrating, in a single macro-phase of assembly (11) and in a single automatic workstation (S2), the entire construction of the panel (400) in its main structure (401, 402, 403), leaving to the following stations only the inter-string contacting or bussing (S3) and the front stratifications (S4, S5). In principle, this invention allows to simultaneously perform the assembly from the cell portion to the panel, according to an integration logic of the type called Cell-to-Module in English language, which is already known for photovoltaic panels with back-contact cells, but is not known for the modern panels where the traditional top-bottom contact cells are advantageously connected in shingled form.

Furthermore, it is proposed a method (10, 11) and an automatic apparatus (20, R3, S2) that are versatile in use, namely bivalent, in such a way as to obtain, also for said panels with traditional shingled cells, the well-known advantages reached by the modern methods and manufacturing plants of automatic type for panels with back-contact cells, as in the known prior art. The invention is therefore suitable for both architectures of photovoltaic panels, where the present description is particularly destined to the pre-arrangement and loading of strings made up of portions of traditional cells that are top-bottom connected in said shingled form, on a backsheet already provided with a lower encapsulating layer for the purpose of insulation and pre-fixing; in case, instead, of a back-contact panel, there is provided the use of a particular conductive and multi-layer backsheet such as, by way of example, in the aforementioned solutions EP2917942 (Baccini et al.), EP3090449 (Baccini et al.) or ITTV2017A084020 (Baccini et al.).

The proposed solution is easily implementable in a production line of the modular and highly automated type, made up of a total number of workstations selected according to the desired production capacity of the line itself, wherein some stations intended for particular assembly phases or sub-phases may be multiplied and/or adjacent and/or opposed one another according to specific project requirements; by way of non-exhaustive example, consider a possible doubling of the automatic apparatus that individually pre-arranges said alternated shingled strings (402) starting from cell portions (403), forming them complete and ready to be loaded one adjacent another on the backsheet, wherein said doubling may provide multiple adjacent lines or symmetrically placed relative to the panel-carrier tray in transit, one opposite to the other, that is one at each side, with synchronization of the loading of adjacent strings and with alternated heads for the purpose of bussing operations, as well as to avoid the downtimes of production. In this way, it is possible to halve the general assembly times concerning said combined and bivalent station. Therefore, by way of non-exhaustive example, in the following description of the invention (10-11, S2) (FIGS. 2-9b), firstly reference is done to a basic embodiment with a single loading line and a single shuttle-tray (FIGS. 4b, 5a, 5b) and then to a preferred high-productivity embodiment with a single printer, but with a double line for initial loading and two shuttle-trays (FIGS. 9a, 9b) that translate parallel and in a coordinated way each other at the sides of said printer.

Figure 6:
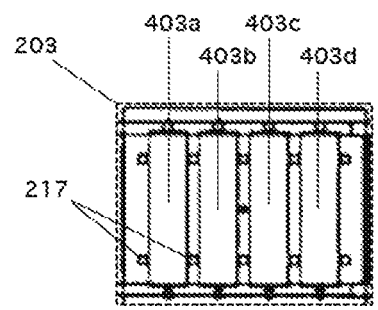
FIG. 6 schematically illustrates a plan view of a box container of equivalent cell portions, which in the example is a cell divided in four identical portions like slices, which are stacked and spaced in a calibrated way for the purpose of the printing. The invention allows, with the same logic, to process an entire cell or any number of equivalent cell portions, which is for example divided in halves, fourth, sixth, eighth or other subdivisions required for a specific panel to be produced.
Figure 7:
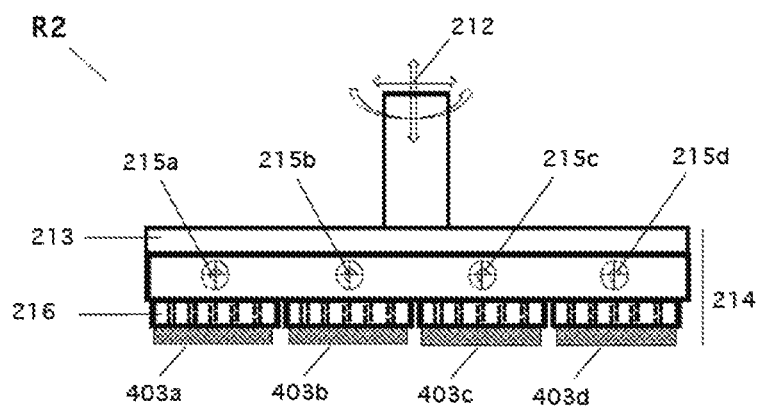
FIG. 7 schematically illustrates a vertical section of a particular handling end member of the second robot (R2), according to this invention, which is provided with chocked vacuum with independent sectors for the partial superimposition between equivalent cell portions.

More in detail, the proposed method (10) provides a particular macro-phase (11) of assembly of said cells on the backsheet (FIGS. 2, 3), wherein the positioning or lay-up of the cells occurs by pre-arranging them first (11.1 11.6) by shingled strings (402), preferably alternated in the direction of construction (211a-211b, FIGS. 8a-8b), starting from entire cells or equivalent cell portions (403), progressively superimposed one another (11.6, R2) immediately after the printing (11.4, 205), on a shuttle-tray (210) that translates back and forth, that is with a bi-directional logic (211, 211a-211b). Preferably, slices of cells pre-cut in equal parts are simultaneously printed, laying on the upward-facing contacts a predefined quantity of ECA (207) by means of a printer (205-207) in a continuous production line, using a technology of the silkscreen printing type or screen-printing, or volumetric dispensing, or jet-dispensing, or other equivalent technology. The progressive superimposition of said portions, one by one, it is carried out by means of a particular handler (R2) with chocked vacuum (214-216) depending on the number of portions (403a-403d) to pick up and release, as described in detail in the following (FIGS. 6-7).

At the beginning of the process of forming of the shingled string (11, 20), in said combined station (S2) or lay-up station, said cell slices or portions (403a-403d) are supplied in their own loading path (201) inside containers (203) that are shaped like boxes (FIGS. 5b, 6), which hold them tidily and repetitively stacked, one next to the other, with interposed spacers (217), in such a way as they can therein be picked up in a predefined groups by a first, even multi-line, handler of the robot type (R1a) or Cartesian portal (R1b), equipped with an end member of the pneumatic gripping hand type, like a perforated plate with vacuum in adhesion or a gripper with suction cups. By way of non-limiting example, in the preferential embodiment of the invention, it is foreseen that each portion is equal to a fourth of a standardized square cell, with sides equal to 156 mm, wherein said container (203) will be opportunely configured so as to carry said four portions on a single level, which are spaced apart, but together equivalent to an entire cell (FIG.

6), in such a way as to be able to be picked up all together (FIGS. 5a And 9a) from the special gripping hand of said first handler (R1a-Rb).

Such a solution ensures a high versatility of use; in particular, when changing the configuration of the supplied portions (403), for example their dimension or geometry, it is foreseen that only the corresponding container (203) and the end gripping devices of the three handlers (R1a-R1b, R2, R3) of the station (S2) shall be changed or adapted, which are interchangeable on the wrist for the above-mentioned purposes, in addition to the obvious changings to the handling program or software and to the printing screen of the ECA adhesive (205, 207). To this end, it is observed that the gripping hand of the first handler preferably consists of a plate machined with vacuum means obtained inside and which are placed according to said number of cell portions to pick up simultaneously; by way of example, a number of four slices is provided if in fourth of cell or a number of six slices if in sixth of cell, and so forth. The second handling (R2), instead, provides a particular gripping end member with chocked vacuum with independent sectors (214, FIG. 7), corresponding to each cell portion to be progressively positioned with a partial superimposition.

In said combined workstation (S2), the macro-phase of lay-up (11) is carried out by means of an automatic shingling apparatus (20) that prints and immediately places said equivalent cell portions (403a-403d) one onto the other like roof tiles, in such a way so as to pre-arrange shingled strings that are alternated also in the direction of construction (210-211), wherein the first laid portion or head is alternatively directed, at the moment of picking (R3), towards the end of the stroke or is even alternated in the polarity once the string is loaded on the backsheet, one next to the other, to facilitate the following phase of bussing. In said apparatus (20), said portions (403a-403d) are supplied in specific containers (203) in a loading path with a conveyor belt of the single-line (201, FIGS. 5a-5b) or multi-line (201a-201b, FIGS. 9a-9b) type, wherein multiple containers (203) can be loaded in a row and wait for their turn of emptying in order to ensure autonomy to the workstation (S2) and therefore to the entire production plant (30). Every container (203) is therefore placed with precision on the loading path (201), at the beginning of the assembly (100), in a loading position (202) where said first handler (R1a, R1b) begins to pick up said cell slices, or the entire cell, in a single gripping operation.

The different operations provided by the invention are in turn assisted by multiple vision systems of the multi-camera type and/or optical inspection AOI, which are structurally and functionally integrated with the different equipment of the station (S2) according to the operative, management and control purposes provided. For the ease of description, such vision systems are grouped (V1, V2, V3) by macro-functions localised as follows: before the printing (V1, R1a-R1b, TC1-TC2), wherein at least the position and/or the alignment of the cell portions are detected depending on the printing screen, after the printing (V2) (R2, AOI1, TC3) to control at least the quality of the execution and the position and/or the alignments of each cell portion for the loading with progressive superimposition on the shuttle-tray, after the completion of the shingled string (V3) (R3, TC4-TC7) to control the alignments and fiducials for the final loading of the string on the backsheet.

More in operative detail (FIGS. 2, 3, 5a-5b, 9a-9b), when said box container (203) reaches the loading position (202), a first handler (R1a, R1b) picks up the equivalent cell portions (403) extracting them from the top (11.1), or a single entire cell, and arranges them in groups for a preliminary control in a position such that a component of a first vision system (V1) can control the actual orientation of the cell slices in order to then correctly position them on the belt for the printing, which for example is an optical inspection means AOI with illuminator or a scanner or a camera integrated in the same structure of the handler or close to it. The same vision system (V1) can also carry out a check on the integrity of said cell portions just extracted, or entire cell, which, in case of verified faults can be successively stored in a separate reject post (11.c). The software of the vision system (V1), therefore, gives instruction to said handler (R1a, R1b) to carry and load (11.2) in an oriented way the group of equivalent cell portions (403a-403d) on a loading belt equipped with vacuum (204) in such a way that they may transit in predefined and oriented way, without altering their relative position, till reaching the printer (205), where a special processing area (206), which is empty in correspondence of the belts, will lift contrary to the head with the printing screen (11.4); this solution, in the preferred case of a type-stencil screen for contact printing.

In the preferred embodiment, before the printing (205) there is also provided a control of the alignments (11.3) of the portions (403) just being loaded on said belt (204), which may be made by means of two cameras (TC1, TC2) positioned in a row one after the other, where the first one (TC1) detects the alignment of the single cell portion on a stationary reference point, while the second one (TC2) detects the alignment on the previous portion. Said first vision system (V1) can provide multiple detectors to control the positions and alignments of the single portions before and after the loading on the belt, if necessary re-configurable according to the precision guaranteed by the handler (R1a, R1b) and/or the possibility of auto-calibration of the printing screen, and the bivalent use of the station (S2); for example, in the alternative case of panels with entire back-contact cells, it is sufficient to activate a single camera (TC2) to control the alignment on the belt.

Once the ECA adhesive is printed (11.4) in the positions defined by the printing screen, the printing processing area (206) lowers and the transport belt equipped with vacuum (204) forwards the ensemble of said portions just printed up to an unloading position, that is picking up (208) by a second handler (R2), which picks up in a single grip said equivalent cell portions as they are. Said handler (R2) is a robot (FIG. 7) equipped with a particular interchangeable gripping tool (214) on the wrist (212, 213), which essentially comprises a plate machined with vacuum devices obtained in the plate itself and which are placed according to the number of portions that shall be picked up simultaneously. Particularly, for the purpose of the invention, it is foreseen that in said second handler (R2) the picking member (214) is advantageously subdivided into independent sectors (216), corresponding to each handled cell portion (403a-403d), which are individually supplied by chocked vacuum channels (215a-215d) as the vacuum circuit is sectioned by an independent pilot-operated valve in such a way that the single gripping and release sectors (216) may be operated at choice, for example with a single programmed sequence or all at once simultaneously. In the alternative case of assembly of back-contact cells, it is foreseen that they are entire and loaded on the backsheet with the ECA adhesive facing downwards, namely overturned, wherein said overturning may occur individually by means of said second handler or may possibly occur at the end, namely simultaneously to the loading on backsheet of an entire row of adjacent cells.

Said device with independent sectors (20, 214, R2) (FIG. 5b, 7, 9a) allows to release each cell portion (403a-403d) one by one, advantageously co-ordinating itself with the movement of the shuttle-tray (210), wherein the shingled string (402) is progressively formed, which translates back and forth (211a-211b) in a controlled way along a rectilinear axis (211) that is preferably parallel to said loading belt (204), corresponding to the longitudinal axis of the string under construction. It (210) acts as a mobile support, wherein the single portions (403) are progressively laid (11.6) one onto the other with a partial superimposition (404) at the ECA adhesive (207), in such a way as to pre-arrange complete single shingled strings (402) in a continuous cycle, which are ready for the immediate picking up and transport (R3) on the backsheet (401); therefore, they are in turn alternated in their orientation of the head, that is of the first stored cell portion (FIGS. 8a, 8b) depending on the construction direction on said shuttle-tray (210) translating back and forth, namely forward (211a) or backward (211b). It has been experimentally observed that this alternation makes the manufacturing process faster and considerably reduces downtimes due to idle translations. Moreover, it can facilitate the following phase of bussing (S3) between adjacent strings, simplifying the interconnection elements reported and/or reciprocating the polarity between the heads.

Prior to said coordinated and progressive release (11.6), the second handler (R2) places the group of printed portions, picked up from the belt at a control position (11.5) wherein a first detector (AOI1) of the second vision system (V2), preferably of the optical inspection type with illuminator, checks the quality of the printing of ECA carried out, while a second detector like a camera (TC3) checks, from the bottom to the top, the actual orientation of the individual cell portions in said gripping hand (214) of the robot (R2). Said second vision system (V2), therefore, can carry out the check on the integrity of said cell portions, or entire back-contact cell, which in case of confirmed deficiencies can be stored in a separate reject post (11.c).

After such acquisitions (V2), the vision software gives instruction to said second handler (R2) to carry and direct (212) said group of printed cell portions (403, 207) in the correct position of progressive superimposition, wherein the gripping hand (214) of the robot (R2) will release, according to a predefined sequence (11.6), a single portion at a time (403a, 403b, 403c, 403d) on said shuttle-tray (210) that translates in a way coordinated to it (R2), chocking the gripping with independent sectors (216) by means of selection valves of the corresponding channels vacuum (215a, 215b, 215c, 215d), in such a way as to easily and precisely carry out a predefined superimposition (404) of each single portion. After each loading, said shuttle-tray (210) executes a controlled movement in such a way that the following loading can be placed in the same position, with an identical movement (212) of the arm of the robot (R2, 214), and so until the completion of the string (402). In principle, said handler (R2) and said shuttle-tray (210-211) operate together like a plotter, i.e. a working or writing unit, wherein a first mobile means, or head, is moved along one or more axes and handles a tool and/or a product as regards a second mobile means, or support, which simultaneously translates or rotates in a way combined to it, that is synchronized in order to carry out complex operations on more axes, in a confined space; said working unit operating with the help of electronic optical vision systems and with a logic control unit.

After having reached the end-of-stoke stop (210, 211a) or anyway the correct unloading position, it is foreseen that the entire string (402) is picked up (11, 7) by a third handler (R3) of the picking bridge type (250, 251) made up of a Cartesian portal (250) with a gripping and pre-fixing device (251) corresponding to the entire string, to be immediately controlled and transferred on the backsheet (401) that transits on a panel-carrier tray (300) that crosses the entire assembly line (30); said gripping and pre-fixing device (251) is of the pneumatic type and firmly holds each single cell or portion of shingled cell (403). Simultaneously to said transfer, therefore, there is the visual inspection (V3, 11.8) of the alignments of said string and of possible cracks, as well as of the stationary references or fiducial points on the backsheet and/or tray. Said positioning of each string is immediately followed by a fast-thermal fixing on the encapsulating layer of the backsheet (401), also called pre-fixing (11.9), performed with localised heating according to prior art, as for example in EP3090449 (Baccini et al.).

At the service of said third handler (R3), there is therefore provided a third vision system (V3, TC4-TC7) that firstly detects, from the bottom, (TC4) the head-tail alignment of the shingled string just being formed and picked up, relative to the gripping device, by means of two acquisitions of beginning-end of the string, also called head-tail; then, a network of detectors is placed above the panel under assembly or above the backsheet (401), for example three pairs of cameras (TC5, TC6, TC7) placed along the broadsides, suitable to detect the stationary references of the product, called fiducials, like coordinates useful to said gripping and pre-fixing device (251) in order to correctly position the shingled strings (402) adjacent one another.

In a more detailed embodiment of said gripping and pre-fixing device (251), for the purpose of firmly holding each single cell or shingled cell portion (403a-403d), the same is preferably shaped like a perforated plate that acts in adhesion on the string, with vacuum activated only on the holes corresponding to each cell portion; as an alternative, an equivalent micro-pneumatic system with suction cups or gripper is suitable. Moreover, means for the localised heating are arranged, which are suitable for the immediate pre-fixing to the encapsulating layer of each cell portion that forms the shingled string, avoiding the conventional dry-curing of the ECA adhesive. Said pre-fixing means, alternatively, may be integrated in the holding plate or form a second device of the presser-heater type, with similar shape, that operates in the same Cartesian portal in a coordinated way to it.

The production sequence (FIGS. 2, 3) of a photovoltaic panel with shingled cells, therefore, according to the assembly method (10) proposed by the invention (FIG. 2), includes a first phase operative (101, 51) of positioning a backsheet with encapsulating layer (401) facing upwards on a panel-carrier tray (300) that horizontally passes through the different workstations (S1 S6) placed in a row, to return (301) then to a lower level (FIGS. 4a-4b), then a second innovative operative phase called macro-phase (11) of lay-up, wherein different operations called operative sub-phases (11.1-11.9, 11.c, 11.s) are integrated in a coordinated and simultaneous way, and which are described in detail in the following, therefore a third operative phase (103, S3) of bussing of said shingled strings of the previous macro-phase (11, S2), followed by a fourth operative phase (104, S4) of superimposition of the upper encapsulating layer and corresponding control, then a fifth operative phase (105, S5) of laying of the front glass, and finally a sixth operative phase (106, S6) of overturning the layered panel, for its delivery to the rolling furnace. In case of bivalent use of the station (S2), to assemble panels with back-contact cells, as an alternative to the above-mentioned superimposition phase (11.6, 404), it is foreseen that the entire printed cells are loaded (210, R2) and aligned without superimposition like a string of cells that are not electrically connected, and preferably top-bottom overturned by means of the same gripping means with vacuum (R3) suitable to transfer and load them with the contacts facing downwards, on a backsheet of conductive type; therefore, in the case of back-contact cells, the above-mentioned station of bussing (S3) remains unused.

With greater reference to the operative details of the proposed method, the pre-fixed aims are achieved by printing and immediately pre-arranging the cell portions (403a-403d) for shingled strings (402), alternated in the direction of construction, according to a macro-phase of lay-up (11; S2) including the following operative sub-phases (11.1-11.9, 11.c, 11.s) that are functionally integrated one another in such a way as to print and pre-arrange said shingled strings, load and pre-fix them on the backsheet in a continuous cycle (FIGS. 2,3), without intermediate drying or dry-curing:

- (11.1) first sub-phase of picking with a first robot (R1a-R1b), from a container (203, 217) like a box (FIG. 6), equivalent cell portions (403) corresponding to an entire cell cut into identical slices (403a, 403b, 403c, 403d), arranged in adjacent stacks and with the contacts upwardly facing, with control of the actual position in order to orient the following laying on a belt and with possible checks for cracks or other non-compliances;
- (11.2) second sub-phase of oriented loading of said equivalent cell portions on a loading belt (204) with pneumatic vacuum for holding them;
- (11.2) third sub-phase of visual inspection (V1) of the actual positioning with possible checks;
- (11.4) fourth sub-phase of silkscreen printing (205) of the ECA conductive adhesive (207) on the contacts of each equivalent cell portion;
- (11.5) fifth sub-phase of visual inspection (V2) of the quality of the ECA laying and possible re-positioning, that is correction of the orientation of the printing screen or stencil, with detection of the actual position, that is the alignments of each portion for the purpose of the following release, and possible checks;
- (11.6) sixth sub-phase of progressive superimposition like roof tiles, of said equivalent cell portions (403a, 403b, 403c, 403d) obtaining complete shingled strings (402) that are alternated in their head polarity, by means of a second robotic handler (R2) with chocked gripping hand (214-216) that arranges them one by one on a bi-directional shuttle-tray (210), translating back and forth along a rectilinear axis (211) corresponding to the axis of the string under construction and parallel to said loading axis (204). The direction of superimposition of said portions is in turn reciprocated, that is being the same until the completion of a string (402) along the forward path (211a) of said shuttle-tray (210), then returning (211b) with superposition in the opposite direction;
- (11.7) seventh sub-phase of picking said alternated shingled string with a gripping bridge at the end-of-stroke stop (211a) of said shuttle-tray (210), wherein a plate with activated vacuum on each portion of the shingled string translates on a Cartesian portal (250), picks it up entirely (402) to then orient it and translate it up to the backsheet, clearing said shuttle-tray for its return (211b). To create a string head with polarity opposite to the previous one, for the purpose of facilitating the contacting between adjacent strings, there is possibly provided to overturn of the entire string in an alternated way, namely every other string;
- (11.8) eighth sub-phase of control (V3) of the tail-head alignment of said shingled string, with possible checks.
- (11.9) ninth sub-phase of oriented loading or laying, and pre-fixing with localised heating of said shingled string (402) on the backsheet with the encapsulating layer (401) facing upwards, based on the position of stationary references or fiducial points (V3);
- (11.c) possible sub-phase of unloading the cracked and/or non-compliant equivalent cell portions, as an alternative to the second (11.2) or sixth (11.6) sub-phase;
- (11.s) possible sub-phase of unloading of the cracked and/or non-compliant strings, as an alternative to said ninth sub-phase (11.9).

Particularly, with respect to the known solutions for back-contact cells of documents EP2917942 (Baccini et al.), EP3090449 (Baccini et al.) or ITTV2017A084020 (Baccini et al.), the invention (10, 11, S2, S3) provides to print and pre-form complete strings (402) starting from cells or cell portions with top-bottom contact, which are superimposed in shingled form (402, 404) on the electrical contacts (207), in such a way as to immediately load them on a non-conductive backsheet in a continuous cycle and without separate operations, to industrially operate in the advantageous Cell-to-Module mode using traditional cells with top-bottom contact. Such a result is achieved with a progressive superimposition (210, 404, R2) of the portions of a cell just being printed, one by one, by means of an innovative tray apparatus made up of a shuttle-tray with bi-directional translation (210, 211) and coordinated in the movements to the handler (R2) that is able to move and rotate a special pneumatic gripping tool (212-216) suitable to individually release (215a-215d) each portion and operating in a coordinated way to said shuttle-tray (210) and to a dedicated vision system (V2, TC3), thus obtaining (11.1-11.6) shingled strings (402) already ready to be immediately transferred and fixed on a non-conductive backsheet (11, 7 11, 9).

It is observed that the application of a similar loading with pre-fixing is known only for the assembly of adjacent back-contact cells, wherein a handler of the Cartesian portal type picks them up and transfers them also applying localised heating for the purpose of fixing them on the encapsulating layer of a backsheet of the conductive type, which electrically interconnects them therein forming the strings of the panel. In the known solutions, in fact, there are no problems related with the simultaneous handling of cells already electrically contacted and specifically arranged, without dry-curing. This invention (11, S2) provides to transfer non-conductive complete strings of the shingled type (402) on a backsheet, which are pre-formed with single portions of cell (403) and electrically contacted for top-bottom superimposition (11.6) at the contacts (207, 404), wherein the ECA is printed (11.4); therefore, said shingled strings are pre-arranged and interconnected prior to their transfer on the backsheet, which is provided with the encapsulating layer only and not necessarily with a conductive layer, therefore it is essential to handle and load them without no relative translation between the cell portions, and particularly at the ECA adhesive on the electrical contacts on the ECA, thus avoiding the conventional operations of intermediate drying or dry-curing provided for shingled strings. To this end, a handler (R3) is provided, which is able to pick and correctly orient the entire string by applying vacuum on each cell portion (403a-403d), in order not to alter the contacting and the corresponding alignments, which is also combined to an integrated vision system (V3) that, prior to the loading, checks the actual alignment of the string with tail-head acquisitions on a stationary reference point (TC4), preferably from the bottom to the top, and then checks from the top (TC5-TC7) the actual positioning relative to a network of stationary references, like fiducial points or fiducials, on the tray and/or on the backsheet.

In this way, it is possible to perform, in a continuous back and forth cycle (210-211), complete and already electrically contacted strings, also alternated in the direction of the head of the string, that is the first portion laid according to the direction of construction, namely of translation of said shuttle-tray, thus considerably reducing time and industrial costs for production. In particular, the proposed solution (10, 11) is feasible in a single workstation (S2) of the compact and integrated type, which is automatic in the operation and combined in the functions, wherein said printing, said pre-arrangement of shingled strings and said loading on a backsheet are carried out simultaneously and without dry-curing. Moreover, it shall be noticed that the proposed solution (10, 11) allows a bivalent use of the equipment, wherein said combined station (S2) of lay-up is particularly suitable for assembling, in an innovative and advantageous way, the aforementioned shingled strings (402) on a non-conductive backsheet, but also allows to transfer adjacent back-contact cells on a conductive backsheet according to a substantially known technique, with an extreme versatility of use and saving investments as it is nowadays required to the manufacturers of photovoltaic panels.

The production plant (30) (FIGS. 4a, 4b) suitable to carry out the proposed solution is made up of automatic workstations (S1-S6) placed in a continuous line, wherein, compared to the aforementioned known solutions, it is foreseen that said second station (S2) of lay-up performs a substantially different sequence of operations for the purpose of said pre-arrangement in a continuous cycle (11.1-11.6, 20) of shingled strings (402) starting from said portions (403a-403d) of traditional cell, and load them immediately (11.7-11.9, R3) on a non-conductive backsheet without relative translations and without dry-curing, as set forth above. Moreover, a following third station (S3) of simplified bussing of said shingled strings (402) is introduced, which is obviously not used in said alternative case of assembly of back-contact cell panels. Furthermore, at the beginning of the plant, a possible preparatory station (Sp) is provided in order to convey non-standard formats of photovoltaic panel.

More in detail of the provided equipment, it is proposed an advantageous combined and bivalent station (S2) for panels with alternated shingled strings (402) or also back-contact panels with adjacent cells, which comprises a particular automatic shingling apparatus (20) made up of means (201 216, R1-R2, V1-V2) coordinated one another in such a way as to pre-form strings starting from a single cell or equivalent cell portions (403), which operate in a functional combination also with the automatic means of loading and pre-fixing (R,; V3) on the backsheet of said pre-formed strings, like an automated operative, compact and multifunction unit, wherein said pre-arrangement function of the shingled string (20) and that of its positioning on the backsheet (R3) interface at the end-of-stroke stop of said shuttle-tray (210), according to an integrated logic of assembly, called cell-to-module, that is applied to panels with strings formed by superimposed or shingled cell portions (404). To this end, said shingling apparatus (20) is integrated and coordinated with all the other means of the operative station (S2) of lay-up (FIGS. 5a, 9a, 9b), including the multiple vision systems (V1-V3) and the electronic means for the management and control of the station (S2) and of the entire plant (30).

In the basic embodiment illustrated in the figures (FIGS. 5a and 5b), a single loading path (201) of equivalent cell portions (403) and a single shuttle-tray (210) are provided, wherein said shingled string (402) is pre-formed; in that case, the first handler, intended to load said cell portions from the box containers, is advantageously an articulated arm robot (R1a) coordinated to a first vision system (V1). The second handler (R2) is a robot with a particular gripping tool (214) provided with chocked vacuum (215a-215d), which is coordinated to the movement of said shuttle-tray (210) and to a second vision system (V2). The third handler (R3) is a Cartesian portal (250, 251) coordinated to a third vision system (V3), comprising a multifunction gripping and pre-fixing means (251) that translates from the end-of-stroke stop closer to said shuttle-tray (210) up to the backsheet; such means (251) is of the pneumatic plate type and suitable to pick up and translate an entire pre-formed shingled string (402) without relative movements among the pieces (207, 402, 404), acting with the vacuum on each cell or cell portion (403), and is simultaneously joined and/or combined with heating means that introduce localised heat on each cell or cell portion, for the purpose of a punctual pre-fixing on the encapsulating material of the backsheet.

The gripping and pre-fixing means (251) can be split apart, wherein the gripping means and the pre-fixing means are separated when operating, but coordinated in their action, being of similar shape and translating on the same Cartesian portal; such a case is schematically illustrated by way of example in said basic embodiment (FIGS. 5a, 5b), wherein a first element with a perforated pneumatic plate or gripper or equipped with micro suction cups is provided, which picks up and places each string on the backsheet in such a way that a second pre-fixing element immediately supplies localised heat on each cell portion, avoiding any relative movement among the portions. Alternatively, for special production and/or plant requirements, it is possible to provide an equivalent handling system, wherein the gripping and pre-fixing means are integrated in a single multi-function element, such as for example a versatile, smooth contact plate with vacuum holes selectively activated on each cell portion of the shingled string, in order to grip without relative translations, and with heating means inside it for an immediate pre-fixing simultaneously to the laying. Such a case is schematically represented, by way of example, in the preferred high-productivity embodiment (FIGS. 9a, 9b) where it (251) is illustrated as dashed in the picking position, while it is represented with a continuous line in the final pre-fixing position on the backsheet.

Figure 8A:
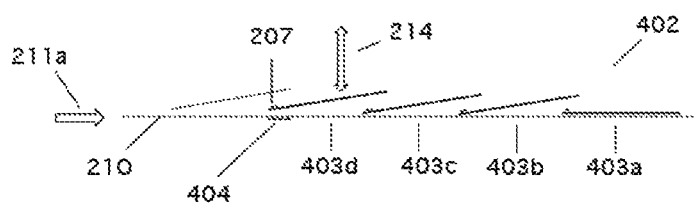
FIGS. 8a and 8b are simplified schematic views concerning the progressive superimposition of said equivalent cell portions when forming a shingled string, by means of a handler (R2) equipped with a gripping hand with chocked vacuum with independent sectors, which releases the equivalent cell portions one by one, on a shuttle-tray that translates, in a bi-directional way and coordinated to it, operating both to-and-fro, wherein at the return of the shuttle-tray (FIG. 8b) the direction of superimposition is opposite to that of forward (FIG. 8a), reciprocating the head direction, namely the first laid cell, to facilitate the production and the bussing contact between near strings.
Figure 8B:
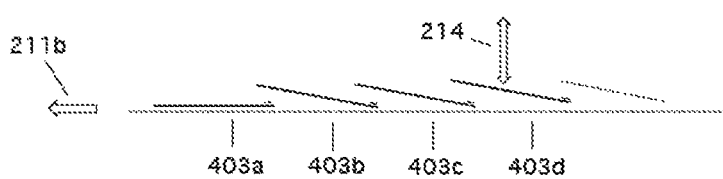
Figure 9A:
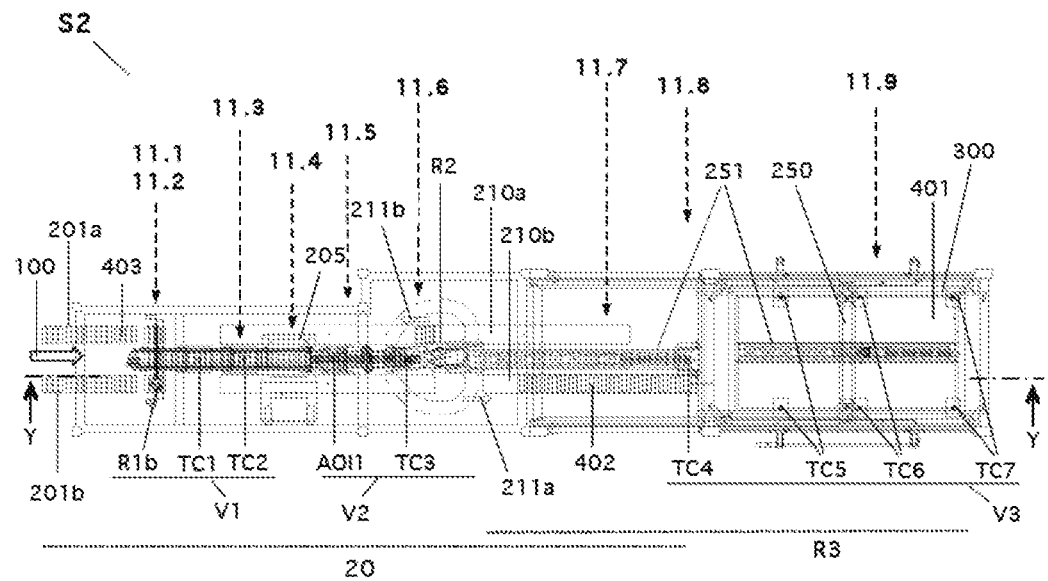
FIGS. 9a and 9b are views of said combined and bivalent station (S2) object of this invention, respectively a plan view (FIG. 9a) and a raised view (FIG. 9b) according to the section line Y-Y, in the preferred embodiment with high productivity, with double initial loading path and double shuttle-tray wherein shingled strings are formed to-and-fro; in this case, the first handler suitable to load the cell equivalent portions from the containers is of the Cartesian portal type (R1b) and transversely acts on both initial loading paths serving the central pneumatic belt. Vision systems are here indicated in detail at each detection point (AOI1, TC1-TC7). The third handler (R3), with Cartesian portal, provides a multifunction gripping device that simultaneously performs both the loading and the immediate pre-fixing by acting on each portion of the string, which is conventionally shown as dashed in the initial position of picking of the string, namely on the end-of-stroke stop of the shuttle-tray.
Figure 9B:
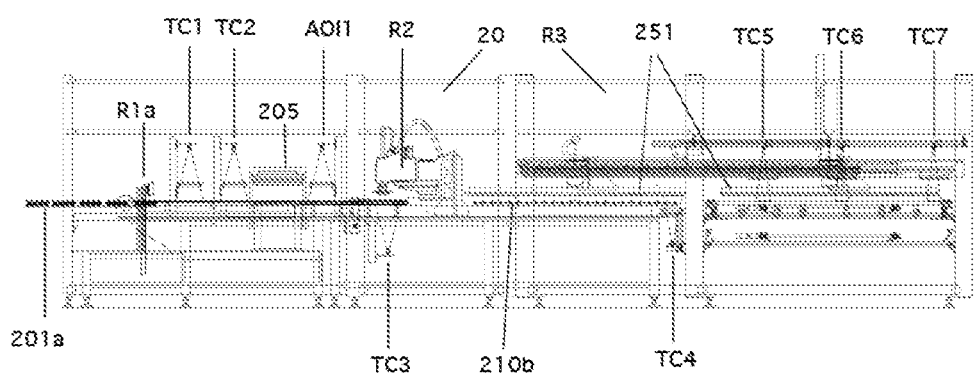

Therefore, the following means are provided starting from the beginning (100) of said macro-phase (11):

at least one loading path (201) for the boxes (203), with spacers (217), which contain the equivalent stacked cell portions (403);

a first handler of the robot type (R1a) (FIG. 5a, 5b) or a Cartesian portal (R1b) (FIG. 9a, 9b) with gripping means with pneumatic plate, interposed between said loading path (201) and a loading belt (204) leading to the printer, for picking and loading said equivalent cell portions;

at least one loading belt (204) provided with vacuum, on which the equivalent cell portions picked up (R1) from the box are placed, serving as a controlled extension of said loading path, which holds them translating the same first in the correct position for the printing (205, 206) and then in the picking position (208, R2);

at least one flat silkscreen printer (205), crossed by said belt (204) with vacuum, comprising a processing area (206) wherein the laying of ECA (207) on said equivalent cell portions is performed;

a second robot handler (R2) (FIG. 7) equipped with a particular orientable gripping hand (214), with independent sectors (216) and chocked vacuum channels (215), which is interposed between said position of picking (208) from the belt and the position of loading (209) on a shuttle-tray (210) that is coordinated to it, in order to load the equivalent cell portions just printed and position them, one by one, in a progressively superimposed way (404) on ECA (207) by independently releasing each portion, with translation and orientation of the arm (212) in such a way that it is also coordinated to the progression of the shuttle-tray (210), wherein said progressive loading occurs in a continuous cycle in both directions of translation with the superimposition (404) in turn directed in the opposed direction in order to obtain a shingled string with alternated orientation of the head, that is the first laid cell in adhesion on the plane (FIGS. 8a, 8b);

at least one shuttle-tray (210) supporting and holding the string under construction, which translates back and forth in a bi-directional way (211a-211b) on a rectilinear axis corresponding to the longitudinal axis of the string and which is parallel to said loading belt (204), with an end-of-stroke stop in the coordinated position of picking (R3) of the shingled string;

a third handler (R3) of the gripping bridge type with vacuum, namely a pneumatic plate (251) that translates on a Cartesian portal (250), assisted by a multi-point vision system (V3), external to the equipment (20), but integrated in the same station (S2).

Moreover, the following vision systems are provided:

a first vision system (V1) with automated optical inspection or AOI, at said first robot (R1a, R1b), in order to control the actual position of the equivalent cell portions before the laying (11.2) on the belt (204), so as to orient the loading, and after it to check the actual alignments (11.3) for the purpose of the printing and check for cracks and/or non-compliances;

a second vision system (V2) with automated optical inspection or AOI, at the said second robot (R2), to check for the actual laying of printed ECA (11.5) and to assist in the progressive superimposition (11.6) of the cell portions when forming the shingled strings (402) on the shuttle-tray (210);

a third vision system (V3) with automated optical inspection or AOI, at the third handler (R3) to check for the actual alignment of the shingled string being picked up (11.8) and therefore load it correctly on the backsheet relative to the stationary points (11.9).

In the preferred high-productivity embodiment of the invention (11, S2), being of the multi-line type (FIGS. 9a, 9b), two loading paths (201a-201b) of the boxes (203) are provide, which are coupled to a first handler (R1b) of the Cartesian portal type in such a way that the pneumatic gripping means moves transversely, with rapidity and precision, on both lines; in particular, there is provided the use of at least two identical bidirectional shuttle-trays (210a, 210b), which are placed parallel to the sides of said printer (205), namely one at each opposite side relative to it, which translate back and forth (211a, 211b) in a coordinated way with respect to each other and coordinated with respect to said handler (R2, R3) to operate continuously without working downtime, also in the mode that is technically called in background operation to the machine. In this way, for example, while a first shuttle-tray (210a) is at the end-of-stroke stop near the third handler (R3) in such a way to be able to pick up and load the shingled string just being formed (402) on the backsheet (401), a new shingled string is simultaneously under formation on the other shuttle-tray (210b) by means of the second handler (R2).

With reference also to the figures (FIGS. 9a, 9b), in the preferred embodiment, it is provided a first vision system (V1, TC1-TC2) near said first handler (R1b), in order to control the actual positioning of the cells for the purpose of the printing, which includes two detection points (TC1, TC2) between the loading and the printer, wherein a first point (TC1) provides the position of the first of said equivalent cell portions (403a-403d) relative to a stationary reference, while the second point (TC2) allows the alignment of the second of said portions on the first. It is observed that in the case of entire MWT cells, the alignment occurs using only one detection point (TC2). It is thus apparent that said first vision system (V1) may include a higher or lower number of detection points depending on the particular technology adopted to handle said containers, and/or to load the cells or cell portions on the pneumatic belt, and/or to calibrate the printing screen.

There is then (FIGS. 9a, 9b) a second vision system (V2, AOI1-TC3) placed after the printer (205) and near the second handler (R2), wherein, in a first detection point (AOI1), two acquisitions of the cell portion just being printed are executed for the purpose of controlling the quality and the alignment of the printing, possibly with a consequent calibration of the printer or the reject of non-compliant products, while in a second point (TC3) the alignment of the cell or cell portion relative to the gripping hand of the robot is detected from the bottom for the correct alignment of the same on the shuttle-tray that acts as a tray machine.

Finally, there is (FIGS. 9a, 9b) a third vision system (V3, TC4-TC7) assisting the third handler (R3), where firstly the alignment of the shingled string just being printed relative to the gripping device is detected from the bottom (TC4), by means of two acquisitions of beginning-end of the string, while a network of cameras is placed above the panel being assembled, for example three pairs (TC5, TC6, TC7) placed along the broadsides and suitable to detect the stationary references of the product called fiducials, like coordinates that are useful to said gripping device of the handler (R3) suitable to correctly position each string on the backsheet.

REFERENCE (10) automatic assembly method for a photovoltaic panel with traditional superimposed or shingled cells, according to this invention;

(100) start;

(101) operative phase of horizontal positioning of a backsheet with an encapsulating layer on a clear panel-holder tray, (103) operative phase of bussing the alternated shingled strings, (104) operative phase of superimposition of the upper encapsulating layer, (105) operative phase of laying of the front glass, (106) operative phase of overturning the layered panel;

(11) macro-phase of lay-up, with printing, pre-arrangement, loading and pre-fixing of complete and alternated shingled strings, according to this invention, with an integrated assembly logic of the Cell-To-Module type.

Said macro-phase consists of operative sub-phases (11.1-11.9, 11.c, 11.s) functionally combined one another and integrated in such a way as to pre-arrange and directly load, in a continuous cycle and without intermediate drying, complete shingled strings that are alternated in the head direction, for the purpose of the following connection between strings or bussing;

(20) automatic shingling apparatus, object of this invention, for printing ECA and pre-arrange shingled strings with cells or cell portions of the traditional type, with top-bottom contacts, connected with a partial superimposition in shingled form, ready to be loaded and pre-arranged without intermediate drying on a backsheet with encapsulating layer.

(201) loading path of the boxes;
(202) loading position of cells or cell portions;
(203) boxes or containers with stacked cells, which are entire or equivalent cell portions that are stacked and adjacent one another with interposed spacers;
(204) loading belt with vacuum;
(205) flat silkscreen printer of ECA;
(206) printing processing area of the equivalent cell portions;
(207) conductive adhesive, of the ECA type at the electrical contacts;
(208) picking position of the printed cells;
(209) loading position, on the shuttle-tray;
(210) shuttle-tray supporting and holding the shingled string under construction, of the bi-directional back-and-forth translation type on a rectilinear axis;
(211) rectilinear axis of horizontal movement, back and forth (211a-211b);
(212) wrist of the robot, with controlled movement in vertical and horizontal direction and rotation;
(213) fixing plate;
(214) end handling member of the pneumatic type, with chocked vacuum with independent sectors;
(215) chocked vacuum channels (215a-215d), controlled independently to sequentially release the cell portions, one by one (403a-403d), in combination to the translation of the shuttle-tray;
(216) independent sector, for the purpose of the release;
(217) spacers;
(250) Cartesian portal of the type with frame structure, which supports longitudinal and transverse axes of handling wherein at least one gripping and pre-fixing device slides;
(251) gripping and pre-fixing device, comprising pneumatic gripping means to pick up and translate an entire shingled string just being formed, for example of the perforated plate type with selective vacuum in adhesion or gripper or micro suction cups, with also means for the localised heating for the purpose of an immediate pre-fixing of each cell portion that forms the shingled string to the encapsulating layer, avoiding the conventional dry-curing of the ECA adhesive. Said pre-fixing means can, alternatively, be integrated to said gripping device or form a second device, like a presser-heater of shape similar to the first one and suitable to operate in the same Cartesian portal in a coordinated way to it;
(30) automatic assembly plant for a photovoltaic panel, according to this invention, made up of multiple workstations (S1-S6, Sp) aligned in a consequential way and crossed by a panel-holder tray, wherein particularly the second station (S2) is an innovative combined and bivalent station to carry out the proposed assembly method;
(300) panel-holder tray;
(301) empty return tray, recirculating at the lower level;
(400) panel;
(401) backsheet with encapsulating layer;
(402) alternated shingled string, according to this invention, namely a string made with cells or cell portions that are partially superimposed on the contacts like roof tiles, being complete and ready to be loaded and pre-fixed on the backsheet without intermediate drying, and in turn alternated in the direction of the superimposition. The shingled string, in fact, exhibits the head at the end of the stroke, namely the first cell is laid in a full adhesion and in turn placed in the opposite direction as the shuttle-tray translates back and forth by progressively forming each string both during the forward and backward movement, without working downtime.
(403) equivalent cell portions, that is photovoltaic cell portions that are identical one another, corresponding to an entire cell divided in equal pieces like slices, for example in the number of four portions (403a-403d), each one corresponding to a fourth of a standard cell having sides that are equal to 156 mm in the figures of this invention, or any other subdivision in equal pieces;
(404) area of superimposition between cells or cell portions, on the conductive adhesive just being printed;
(R1, R1a-R1b) first handler, with pneumatic gripping hand as a plate machined with vacuum devices obtained in the plate itself and placed according to the number of slices that shall be picked up simultaneously, for example four slices if in fourth of cell or six slices if in sixth of cell. Such a handler is preferably of the robot type (R1a) in the case of a single loading path and a single shuttle-tray, or a Cartesian portal (R1b) rapidly serving multiple lines that are parallel one another;
(R2) second handler, coordinated to the movement of the shuttle-tray, of the robot type with pneumatic gripping hand with independent sectors and chocked vacuum to progressively release each cell portion one onto the other, with a partial superimposition;
(R3) third handler, of the Cartesian portal type, wherein a pneumatic gripping tool corresponding to the entire string translates, such as for example a plate provided with vacuum holes that can be activated on each cell portion of the string, or a gripper plate or with micro suction cups, also including heating means suitable for the localised pre-fixing on the encapsulating layer. Said plate and said heating means are preferably integrated in a single monolithic element or may be two elements coordinated one another and engaged on the same Cartesian portal in order to act on the same shingled string, one immediately after the other, avoiding any relative translation between the single cell portions.
(S1-S6, Sp) workstations of the automatic assembly plant (30), according to this invention; the first station (S1) is for the positioning of a backsheet with an encapsulating layer on a panel-holder tray, the second station is an innovative combined station (S2) of lay-up for strings shingled with superimposed cells, and it is bivalent in the use in order to load adjacent back-contact cells, the third station (S3) is for the bussing of the shingled strings and therefore is not used in case of back-contact cells, the fourth station (S4) is for the superimposition of the upper encapsulating layer, the fifth station (S5) is for the superimposition of the front glass, the sixth station (S6) is for the overturning of the panel for the end rolling. In the case of panels with non-standard formats, at the beginning a preparatory station (Sp) is possibly pre-arranged;

(V1, V2; V3) first, second and third vision system, of the multi-function and integrated type, with multiple control cameras (TC) and/or automated optical inspection means (AOI), being respectively: in correspondence of the first handler (R1a-R1b, TC1-TC2; V1) and before the printer to allow for an oriented loading of the cells or cell portions for the purpose of the printing; then in correspondence of the second handler and after the printer (R2, AOI1, TC3, V2), to control the quality of the printing and successively the exact position of the contacting points relative to the edge of the cell; finally, in correspondence of the third handler (R3), before the loading on the backsheet to detect the alignment of the shingled string on the shuttle-tray by means of two acquisitions (TC4), on the first and the last cell, with also a network of cameras above the backsheet (TC5, TC6, TC7) that allows the exact positioning and final pre-fixing of each string relative to the stationary reference points.

I claim:

1. An automatic assembly method for making photovoltaic panels with cells of crystalline silicon with top-bottom contacting, each of the cells having a positive electrical contact and a negative electrical contact interconnected with a partial superimposition on opposite faces of the respective cells, the respective cells being subdivided into portions identical to each other, the automatic assembly method comprising:
    a positioning a backsheet with an encapsulating layer on a panel-holding tray that horizontally crosses a workstation of an automated plant;
    printing an electronic conductive adhesive on the positive and negative electrical contacts of the cells;
    loading and prefixing the encapsulating layer of the backsheet;
    superimposing an upper encapsulating layer;
    laying of a front glass; and
    overturing the photovoltaic panels so as to send the photovoltaic panels to a rolling furnace, wherein the portions are prearranged in shingled strings in which the electronic conductive adhesive is printed on upward facing contacts after the portions are picked from a box and spaced apart on the pneumatic belt, the electronic conductive adhesive printed portions are laid upon each other in superimposition on the positive electrical contact and the negative electrical contact so as to be progressively pre-arranged in continuously cycled shingled strings, the shingled strings being loaded and pre-fixed on the backsheet, wherein the step of printing the electronic conductive adhesive and the step of pre-arrangement of the shingled strings and the step of loading and prefixing are carried out simultaneously in the workstation, wherein the step of pre-arrangement of the shingled strings is performed by an integrated system having a shuttle-tray support with a bidirectional back-and-forth translation, the shuttle-tray support having a vacuum, the integrated system having a robotic handler having a pneumatic gripping hand with independent sections, the integrated system having chocked vacuum channels cooperating with the vacuum so as to pick printed cell portions by groups and to release the grouped printed cell portions one at a time so as to lay the released printed cell portions in partial superimposition on the shuttle-tray, the shuttle-tray moving in a synchronized manner so as to progressively form the shingled string by the bidirectional back-and-forth translations, the shingled string being picked entire, transported, oriented, laid, and pre-fixed on the encapsulating layer of the backsheet.

2. The automatic assembly method of claim 1, further comprising:
    picking the cell portions from the box with a first handler, the cell portions being stacked and spaced next to each other in the box;
    checking for cracks or non-compliances after the step of picking;
    loading the cell portions on a vacuum belt with the first handler;
    controlling an actual position of the cell portions;
    printing the electronic conductive adhesive on the positive electrical contact and the negative electrical contact;
    progressively superimposing the cell portions on the shuttle-tray with a second handler coordinated with a movement of the shuttle-tray, the second handler having a vacuum gripping hand with independent sections;
    picking and transporting the shingled string with a third handler, the third handler having a Cartesian portal;
    controlling a head-tail alignment of each shingled string;
    loading the shingled string in an oriented manner on the backsheet; and
    immediately pre-fixing the shingled string on the backsheet with stationary optical references.

3. The automatic assembly method of claim 2, further comprising:
    unloading of cracked or non-compliant cells with an automatic optical control.

4. The automatic assembly method of claim 2, the shuttle-tray comprising a pair of shuttle-trays identical and parallel to each other, the pair of shuttle-trays being translatable back-and-forth in an independent and coordinated manner with respect to each other so as to progressively form the shingled string on one of the pair of shuttle-trays while the third handler picks a previously complete shingled string from the other of the pair of shuttle-trays and transports the previously completed shingled string to lay on the backsheet.

5. The automatic assembly method of claim 1, further comprising:
    electrically interconnecting the shingled strings by bussing.

6. The automatic assembly method of claim 5, wherein the step of electrically interconnecting is carried out on the shingled strings with a head polarities thereof alternating.

7. A workstation for automatic assembly of photovoltaic panels having cells with positive and negative contacts on opposite sides of each of the cells, the workstation comprising:
    an automatic shingling apparatus adapted to continuously preform shingled strings from cell portions interconnected in partial superimposition on the positive and negative contacts; and
    a multi-function handling equipment interacting and coordinated with said automatic shingling apparatus and adapted to pick an entire shingled string of the preformed shingled strings in order to load the entire shingled string and to prefix the entire shingled string in an oriented manner on an encapsulating layer of a backsheet, the automatic shingling apparatus comprising:
        a plurality of boxes on a loading path, the loading path having spacers between respective pairs of said plurality of boxes, each of said plurality of boxes containing the cell portions in stacked relation;

a first robotic handler along a single line or with a multi-line Cartesian portal, said first robotic handler interposed between the loading path and a loading belt, the loading belt leading to a printer, said first robotic handler having a vacuum plate gripper shaped in relation to the cell portions, the loading belt having a vacuum adapted to hold the cell portions and to translate the cell portions into a first position for printing by the printer and into a second position for picking by said multi-function handling equipment, the printer being a flat silkscreen printer crossed by the loading belt, the flat silkscreen printer having a processing area for laying an electronic conductive adhesive on the cell portions;

a second robotic handler having an orientable gripping hand with independent sectors having chocked vacuum channels;

a mobile shuttle-tray coordinated with said second robotic handler, said second robotic handler interposed between a picking position and a loading position on said mobile shuttle-tray, said mobile shuttle-tray adapted to support and hold the shingled string, said mobile shuttle-tray being translatable in a bidirectional back-and-forth manner on a rectilinear axis in coordination with said second robotic handler, said mobile shuttle-tray having an end-of-stroke stop corresponding to the picking position; and a third robotic handler interfaced with the picking position of said second robotic handler, said third robotic handler having a Cartesian portal with a robotic gripping hand corresponding to an entire shingled string, said third robotic handler having a plate with holes with an activatable vacuum or a plurality of microsuction cups, said third robotic handler having a heater thereon adapted to localize pre-fixing of each of the cell portions.

8. The workstation of claim 7, further comprising:

a first vision system corresponding to said first robotic handler and positioned before the printer so as to control a position and an alignment of the cell portions and so as to detect cracks or non-compliances;

a second vision system corresponding to said second robotic handler and positioned after the printer so as to control a quality of printing by the printer and a correct position of the positive and negative contacts and to detect cracks or non-compliances; and a third vision system corresponding to said third robotic handler so as to detect an alignment of the shingled string with a pair of acquisitions and a first cell and on a last cell, said third vision system detecting stationary reference points on the backsheet so as to obtain a correct final positioning, said third vision system also detecting cracks or non-compliances.

* * * * *